United States Patent
Malouin et al.

(10) Patent No.: US 12,289,871 B2
(45) Date of Patent: *Apr. 29, 2025

(54) HIGH TEMPERATURE ELECTRONIC DEVICE THERMAL MANAGEMENT SYSTEM

(71) Applicant: JetCool Technologies Inc., Littleton, MA (US)

(72) Inventors: Bernard Malouin, Westford, MA (US); Jordan Mizerak, Belmont, MA (US)

(73) Assignee: JetCool Technologies Inc., Littleton, MA (US)

( * ) Notice: Subject to any disclaimer, the term of this patent is extended or adjusted under 35 U.S.C. 154(b) by 65 days.

This patent is subject to a terminal disclaimer.

(21) Appl. No.: 18/389,300

(22) Filed: Nov. 14, 2023

(65) Prior Publication Data
US 2024/0090180 A1   Mar. 14, 2024

Related U.S. Application Data

(63) Continuation-in-part of application No. 17/475,398, filed on Sep. 15, 2021, now Pat. No. 11,963,341.
(Continued)

(51) Int. Cl.
*H05K 7/20* (2006.01)

(52) U.S. Cl.
CPC ..... *H05K 7/20836* (2013.01); *H05K 7/20772* (2013.01)

(58) Field of Classification Search
CPC ................................................. H05K 7/20836
See application file for complete search history.

(56) References Cited

U.S. PATENT DOCUMENTS

| 236,519 A | 1/1881 | Walsh |
| 3,765,728 A | 10/1973 | Peruglia |

(Continued)

FOREIGN PATENT DOCUMENTS

| CN | 102414813 B | 4/2014 |
| CN | 107567247 A | 1/2018 |

(Continued)

OTHER PUBLICATIONS

Celli, "Compressible fluids," retrieved from the Internet: http://galileo.phys.virginia.edu/classes/311/notes/compflu2/node1.html, 1997.

*Primary Examiner* — Mukundbhai G Patel
(74) *Attorney, Agent, or Firm* — Grady L. White; Potomac Law Group, PLLC

(57) ABSTRACT

A high temperature electronic device thermal management system. Data centers contain many large racks of computer servers with electronic devices that generate heat. For the devices to function properly, they must not exceed a maximum temperature. Typical techniques for thermal management of data center electronics involve using sub-ambient temperature coolants via refrigeration cycles, requiring significant input energy to operate. The present thermal management system includes a flow management system to produce elevated coolant temperatures while sustaining safe device temperatures. This allows the coolant to reject to ambient temperatures globally and year-round, enabling reduced energy usage by no longer requiring refrigeration cycles. Further, operation at or above 55° C. would allow for implementation of additional waste heat recovery processes with increased energy efficiency.

21 Claims, 10 Drawing Sheets

Related U.S. Application Data

(60) Provisional application No. 63/078,650, filed on Sep. 15, 2020.

(56) References Cited

U.S. PATENT DOCUMENTS

| | | |
|---|---|---|
| 3,841,671 A | 10/1974 | Walker |
| 3,980,112 A | 9/1976 | Basham |
| 4,062,572 A | 12/1977 | Davis |
| 4,090,539 A | 5/1978 | Krupp |
| 4,696,496 A | 9/1987 | Guelis et al. |
| 4,796,924 A | 1/1989 | Kosugi et al. |
| 4,890,865 A | 1/1990 | Hosono et al. |
| 4,922,971 A | 5/1990 | Grantham |
| 5,021,924 A | 6/1991 | Kleda et al. |
| 5,088,005 A | 2/1992 | Ciaccio |
| 5,249,358 A | 10/1993 | Tousignant et al. |
| 5,263,536 A | 11/1993 | Hulburd et al. |
| 5,285,351 A | 2/1994 | Ikeda |
| 5,309,319 A | 5/1994 | Messina |
| 5,316,075 A | 5/1994 | Quon et al. |
| 5,349,831 A | 9/1994 | Daikoku et al. |
| 5,401,064 A | 3/1995 | Guest |
| 5,491,363 A | 2/1996 | Yoshikawa |
| 5,547,231 A | 8/1996 | Sharp |
| 5,611,373 A | 3/1997 | Ashcraft |
| 5,687,993 A | 11/1997 | Brim |
| 5,720,325 A | 2/1998 | Grantham |
| 5,959,351 A | 9/1999 | Sasaki et al. |
| 5,999,404 A | 12/1999 | Hileman |
| 6,105,373 A | 8/2000 | Watanabe et al. |
| 6,144,013 A | 11/2000 | Chu et al. |
| 6,366,462 B1 | 4/2002 | Chu et al. |
| 6,528,878 B1 | 3/2003 | Daikoku et al. |
| 6,546,951 B1 | 4/2003 | Armenia et al. |
| 6,550,263 B2 | 4/2003 | Patel et al. |
| 6,550,815 B2 | 4/2003 | Zitkowic, Jr. et al. |
| 6,729,383 B1 | 5/2004 | Cannell et al. |
| 6,952,346 B2 | 10/2005 | Tilton et al. |
| 6,973,801 B1 | 12/2005 | Campbell et al. |
| 7,007,506 B2 | 3/2006 | Kubo et al. |
| 7,104,312 B2 | 9/2006 | Goodson et al. |
| 7,149,087 B2 | 12/2006 | Wilson et al. |
| 7,223,494 B2 | 5/2007 | Takeshita et al. |
| 7,233,494 B2 | 6/2007 | Campbell et al. |
| 7,241,423 B2 | 7/2007 | Golbig et al. |
| 7,265,976 B1 | 9/2007 | Knight |
| 7,277,283 B2 | 10/2007 | Campbell et al. |
| 7,511,957 B2 | 3/2009 | Campbell et al. |
| 7,787,248 B2 | 8/2010 | Campbell et al. |
| 7,802,442 B2 | 9/2010 | Bezama et al. |
| 7,866,173 B2 | 1/2011 | Brunschwiler et al. |
| 7,916,483 B2 | 3/2011 | Campbell et al. |
| 7,978,473 B2 | 7/2011 | Campbell et al. |
| 7,992,627 B2 | 8/2011 | Bezama et al. |
| 8,059,405 B2 | 11/2011 | Campbell et al. |
| 8,266,802 B2 | 9/2012 | Campbell et al. |
| 8,824,146 B2 | 9/2014 | Brok et al. |
| 8,912,643 B2 | 12/2014 | Bock et al. |
| 8,929,080 B2 | 1/2015 | Campbell et al. |
| 8,944,151 B2 | 2/2015 | Flotta et al. |
| 8,981,556 B2 | 3/2015 | Joshi |
| 9,165,857 B2 | 10/2015 | Song et al. |
| 9,247,672 B2 | 1/2016 | Mehring |
| 9,252,069 B2 | 2/2016 | Bhunia et al. |
| 9,445,529 B2 * | 9/2016 | Chainer ............... H05K 7/2079 |
| 9,484,283 B2 | 11/2016 | Joshi et al. |
| 9,521,787 B2 * | 12/2016 | Chainer .................. G06F 1/206 |
| 9,530,818 B2 | 12/2016 | Stern et al. |
| 9,559,038 B2 | 1/2017 | Schmit et al. |
| 9,560,790 B2 | 1/2017 | Joshi et al. |
| 9,622,379 B1 * | 4/2017 | Campbell .......... H05K 7/20318 |
| 9,638,477 B1 | 5/2017 | Choi et al. |
| 9,653,378 B2 | 5/2017 | Hou et al. |
| 9,750,159 B2 | 8/2017 | Campbell et al. |
| 9,852,963 B2 | 12/2017 | Shedd et al. |
| 9,901,008 B2 | 2/2018 | Shedd et al. |
| 9,903,664 B2 | 2/2018 | Joshi |
| 10,078,354 B2 | 9/2018 | Eriksen et al. |
| 10,096,537 B1 | 10/2018 | Chen et al. |
| 10,152,096 B1 | 12/2018 | Chen et al. |
| 10,228,735 B2 | 3/2019 | Kulkarni et al. |
| 10,270,220 B1 | 4/2019 | Eppich et al. |
| 10,285,309 B2 | 5/2019 | James et al. |
| 10,306,802 B1 | 5/2019 | Ditri et al. |
| 10,426,062 B1 | 9/2019 | Saunders |
| 10,473,252 B2 | 11/2019 | Oberdorfer et al. |
| 10,512,152 B2 | 12/2019 | Smith et al. |
| 10,561,040 B1 | 2/2020 | Lunsman et al. |
| 10,651,112 B2 | 5/2020 | Malouin, Jr. et al. |
| 10,665,529 B2 | 5/2020 | Smith et al. |
| 10,903,141 B2 | 1/2021 | Malouin, Jr. et al. |
| 10,985,089 B2 | 4/2021 | Hart et al. |
| 11,018,077 B2 | 5/2021 | Smith et al. |
| 11,096,313 B2 | 8/2021 | Amos et al. |
| 11,322,426 B2 | 5/2022 | Malouin, Jr. et al. |
| 11,439,037 B2 | 9/2022 | Subrahmanyam et al. |
| 11,594,470 B2 | 2/2023 | Smith et al. |
| 11,710,678 B2 | 7/2023 | Ganti et al. |
| 2002/0075651 A1 | 6/2002 | Newton et al. |
| 2002/0113142 A1 | 8/2002 | Patel et al. |
| 2004/0051308 A1 | 3/2004 | Coates |
| 2004/0194492 A1 | 10/2004 | Tilton et al. |
| 2005/0143000 A1 | 6/2005 | Eisele et al. |
| 2005/0210906 A1 | 9/2005 | Laufer et al. |
| 2005/0280994 A1 | 12/2005 | Yazawa |
| 2006/0042825 A1 | 3/2006 | Lu et al. |
| 2006/0250773 A1 | 11/2006 | Campbell et al. |
| 2006/0250774 A1 | 11/2006 | Campbell et al. |
| 2007/0017659 A1 | 1/2007 | Brunschwiler et al. |
| 2007/0091569 A1 | 4/2007 | Campbell et al. |
| 2007/0121294 A1 | 5/2007 | Campbell et al. |
| 2007/0121299 A1 | 5/2007 | Campbell et al. |
| 2007/0221364 A1 | 9/2007 | Lai et al. |
| 2007/0272392 A1 | 11/2007 | Ghosh et al. |
| 2007/0274045 A1 | 11/2007 | Campbell et al. |
| 2007/0295480 A1 | 12/2007 | Campbell et al. |
| 2008/0037221 A1 | 2/2008 | Campbell et al. |
| 2008/0278913 A1 | 11/2008 | Campbell et al. |
| 2009/0013258 A1 | 1/2009 | Hintermeister et al. |
| 2009/0032937 A1 | 2/2009 | Mann et al. |
| 2009/0284821 A1 | 11/2009 | Valentin et al. |
| 2009/0294105 A1 | 12/2009 | Sundararajan et al. |
| 2009/0294106 A1 | 12/2009 | Flotta et al. |
| 2009/0314467 A1 | 12/2009 | Campbell et al. |
| 2009/0316360 A1 | 12/2009 | Campbell et al. |
| 2010/0052714 A1 | 3/2010 | Miller |
| 2010/0276026 A1 | 11/2010 | Powell et al. |
| 2010/0290190 A1 * | 11/2010 | Chester .................. H05K 7/20 174/547 |
| 2010/0328882 A1 | 12/2010 | Campbell et al. |
| 2010/0328888 A1 | 12/2010 | Campbell et al. |
| 2010/0328889 A1 | 12/2010 | Campbell et al. |
| 2011/0277491 A1 | 11/2011 | Wu et al. |
| 2012/0048515 A1 | 3/2012 | Bhunia et al. |
| 2012/0063091 A1 | 3/2012 | Dede et al. |
| 2012/0160459 A1 | 6/2012 | Flotta et al. |
| 2012/0212907 A1 | 8/2012 | Dede |
| 2014/0085823 A1 | 3/2014 | Campbell et al. |
| 2014/0124167 A1 | 5/2014 | Campbell et al. |
| 2014/0126150 A1 | 5/2014 | Song et al. |
| 2014/0158326 A1 | 6/2014 | Lyon |
| 2014/0190668 A1 | 7/2014 | Joshi et al. |
| 2014/0204532 A1 | 7/2014 | Mehring |
| 2014/0205632 A1 | 7/2014 | Gruber et al. |
| 2014/0264759 A1 | 9/2014 | Koontz et al. |
| 2014/0284787 A1 | 9/2014 | Joshi |
| 2014/0293542 A1 | 10/2014 | Vetrovec |
| 2014/0352937 A1 | 12/2014 | Draht |
| 2015/0043164 A1 | 2/2015 | Joshi |
| 2015/0096722 A1 | 4/2015 | Zweiback et al. |
| 2015/0131224 A1 | 5/2015 | Barina et al. |
| 2015/0208549 A1 | 7/2015 | Shedd et al. |
| 2016/0013115 A1 | 1/2016 | Vadhavkar et al. |
| 2016/0014932 A1 | 1/2016 | Best et al. |

(56) References Cited

U.S. PATENT DOCUMENTS

| | | |
|---|---|---|
| 2016/0020160 A1 | 1/2016 | Buvid et al. |
| 2016/0120058 A1 | 4/2016 | Shedd et al. |
| 2016/0143184 A1 | 5/2016 | Campbell et al. |
| 2016/0278239 A1* | 9/2016 | Chainer ............. H05K 7/20309 |
| 2017/0092565 A1 | 3/2017 | Chen et al. |
| 2017/0150649 A1 | 5/2017 | Chester et al. |
| 2017/0179001 A1 | 6/2017 | Brunschwiler et al. |
| 2017/0347487 A1 | 11/2017 | Rudnicki et al. |
| 2018/0027695 A1 | 1/2018 | Wakino et al. |
| 2018/0040538 A1 | 2/2018 | Schuderer et al. |
| 2018/0090417 A1 | 3/2018 | Gutala et al. |
| 2018/0124949 A1 | 5/2018 | Marroquin et al. |
| 2019/0013258 A1 | 1/2019 | Malouin, Jr. et al. |
| 2019/0029105 A1 | 1/2019 | Smith et al. |
| 2019/0195399 A1 | 6/2019 | Nguyen et al. |
| 2019/0235449 A1 | 8/2019 | Slessman et al. |
| 2019/0289749 A1 | 9/2019 | Dariavach et al. |
| 2019/0348345 A1 | 11/2019 | Parida et al. |
| 2020/0006197 A1 | 1/2020 | Hart et al. |
| 2020/0011620 A1 | 1/2020 | Sherrer et al. |
| 2020/0015383 A1* | 1/2020 | Gao .................. H05K 7/20763 |
| 2020/0027819 A1 | 1/2020 | Smith et al. |
| 2020/0033075 A1 | 1/2020 | Veto et al. |
| 2020/0100396 A1 | 3/2020 | Iyengar et al. |
| 2020/0168526 A1 | 5/2020 | Malouin, Jr. et al. |
| 2020/0214126 A1 | 7/2020 | Nakashima et al. |
| 2020/0253092 A1 | 8/2020 | Chainer et al. |
| 2020/0296862 A1 | 9/2020 | Iyengar et al. |
| 2020/0312746 A1 | 10/2020 | Smith et al. |
| 2020/0328139 A1 | 10/2020 | Chiu et al. |
| 2020/0350231 A1 | 11/2020 | Shen et al. |
| 2021/0134703 A1 | 5/2021 | Malouin, Jr. et al. |
| 2021/0265240 A1 | 8/2021 | Smith et al. |
| 2021/0351108 A1 | 11/2021 | Diglio et al. |
| 2022/0087076 A1 | 3/2022 | Malouin et al. |
| 2022/0151097 A1 | 5/2022 | McManis et al. |
| 2022/0230937 A1 | 7/2022 | Malouin et al. |
| 2022/0253112 A1 | 8/2022 | Hinton et al. |

FOREIGN PATENT DOCUMENTS

| | | |
|---|---|---|
| CN | 105027021 B | 4/2019 |
| EP | 3188230 A1 | 7/2017 |
| KR | 20110028428 A | 3/2011 |
| KR | 20190077920 A | 7/2019 |
| WO | 2019018597 A1 | 1/2019 |

* cited by examiner

HIGH TEMPERATURE ELECTRONIC DEVICE THERMAL MANAGEMENT SYSTEM

CROSS-REFERENCE TO RELATED APPLICATION

This application is continuation-in-part of U.S. patent application Ser. No. 17/475,398 filed on Sep. 15, 2021 (published as U.S. Patent Publication No. 2022/0087076 on Mar. 17, 2022), which claims priority of Provisional Patent Application No. 63/078,650 filed on Sep. 15, 2020, the entire disclosure of which is incorporated herein by reference.

BACKGROUND

This disclosure relates to thermal management of heat-generating electronic devices.

Heat-generating electronic devices such as computer processors are ubiquitous. Data centers that house a large number of computer servers, each with heat-generating electronic devices such as processors, are proliferating globally. From early days of search engines and the growth of the internet, to artificial intelligence and machine learning, moving into internet of things and edge computing, performance computing has followed a steep growth curve. Further, as remote work becomes more commonplace in response to global pandemics and efforts for reduced greenhouse gas emissions, efficient data centers appear to be a staple of the emerging future.

Currently, data centers consume between 2-5% of the world's electricity budget, with upwards of 30% of data center electricity dedicated to the thermal management of heat-generating electronics. Therefore, reductions in energy usage rate and improvements in energy efficiency of thermal management in data centers promises to have a notable impact on global sustainability.

In data center operations, electronics dissipate waste heat, causing device temperatures to rise. To function properly, electronics must remain under a maximum temperature. In general, the more computations that are performed, the more waste heat is generated in these electronic devices and the higher tendency for the device temperatures to rise. Therefore, as data center trends continue upward, more computations will be desired. As such, more waste heat will need to be efficiently managed to sustain safe operating temperatures.

Current approaches to cooling in data centers involve using a chilled coolant to remove waste heat from electronic devices. The global maximum ambient temperature ranges from around 20-55° C., which is often warmer than standard data center coolant temperatures around 2-45° C. Therefore, current thermal system configurations frequently require the coolant to be chilled below ambient temperature.

To achieve sub-ambient temperature operation of coolants, a refrigeration cycle is employed. Refrigeration cycles use a refrigerant in a closed loop, whose phase of matter and pressure change throughout the loop to take on heat below ambient temperature. Refrigeration cycles follow the laws of thermodynamics, which results in two major consequences. First, the further below ambient the coolant must reach, the more energy must be provided to achieve the desired coolant temperature. Second, the further below ambient the coolant must reach, the less efficient the process becomes. Unlike cost discounts in buying in bulk, there is an energy premium for continual decrease below ambient temperature.

Thus, as data center electronics generate more waste heat, thermal management systems will require the coolant temperature to be continually chilled below ambient to keep device temperatures under their maximum. This corresponds to high energy usage and low efficiency operation due to the thermodynamic principles of the refrigeration cycle. When the coolant operates above ambient temperature, no refrigeration cycles are needed.

On the other hand, when a coolant takes on waste heat from electronic devices, this waste heat can be re-purposed for other uses in waste heat recovery processes. Re-purposing of waste heat represents an energy efficiency gain, as waste heat from the electronics can be utilized in a productive fashion instead of being dissipated to the ambient environment unused.

However, not all waste heat has equal utility. In general, the higher the temperature of the waste heat, the more effectively it can be used in waste heat recovery processes. For example, certain implementations of the Organic Rankine Cycle require waste heat at a temperature of at least 55° C. Meanwhile, a thermoelectric generator produces electricity based on the magnitude of its temperature difference, meaning the electricity output is greater with increasing waste heat temperature. Therefore, a coolant operating at higher temperatures enables additional waste heat processes and greater energy efficiency potential.

It would, therefore, be useful to have a data center thermal management system with a flow management system to sustain high coolant temperatures while keeping device operating temperatures under their maximum allowable. This would allow the coolant to reject heat at ambient temperatures globally and year-round, enabling reduced energy usage by no longer requiring refrigeration cycles. Further, operation at or above 55° C. would allow for implementation of waste heat recovery processes with increased energy efficiency.

SUMMARY

All examples and features mentioned below can be combined in any technically possible way.

In one aspect, a low energy usage data center cooling system for cooling at least one heat-generating electronic device of at least one computer server includes a first cooling loop comprising a first coolant that is configured to remove heat created by the at least one heat-generating electronic device, at least one component which acts to elevate a pressure of the first coolant, and at least one flow controlling element which acts to control a flow rate of the first coolant within or between portions of the first cooling loop. There is a management system configured to sense the temperature of the first coolant, sense the current temperature at a location either inside of or outside of the data center, catalogue a periodic maximum temperature of an ambient environment in the vicinity of the data center, and adjust the flow rate of the first coolant based on the sensed coolant temperature, and at least one of the current temperature and the catalogued periodic maximum temperature. There is a first heat exchanger interface that is configured to transfer heat out of the first coolant.

Some examples include one of the above and/or below features, or any combination thereof. In an example the management system is configured to maintain the first coolant temperature above the sensed current temperature. In an example the management system is configured to maintain the first coolant temperature above a catalogued annual maximum ambient temperature. In an example the management system is configured to maintain the first coolant temperature above 55° C. In an example the first coolant is a single-phase coolant. In an example the only change of phase of the first coolant occurs at the heat exchanger interface.

Some examples include one of the above and/or below features, or any combination thereof. In some examples the first coolant is a liquid coolant. In an example the first coolant comprises water. In an example the first coolant comprises a water-glycol mix. In an example the cooling system further comprises an air cooling system to provide cooling for other heat generating elements in the computer server.

Some examples include one of the above and/or below features, or any combination thereof. In some examples the cooling system further comprises a second cooling loop comprising a second coolant that is configured to remove heat from the at least one heat-generating electronic device, at least one component that acts to elevate the pressure of the second coolant, and a second heat exchanger interface that is configured to transfer heat out of the second coolant. In an example the second coolant is a liquid coolant. In an example the second coolant comprises water. In an example the second coolant comprises a water-glycol mix. In an example the second coolant comprises a dielectric fluid. In an example the first heat exchanger interface is configured to interface with the ambient environment and the second heat exchanger interface is configured to transfer heat between the second coolant and the first coolant. In an example heat is transferred from the second coolant to the first coolant using a liquid-liquid heat exchanger. In an example the cooling system further comprises at least one cooling element that is configured to facilitate direct contact of the second coolant with a heat generating electronic device.

Some examples include one of the above and/or below features, or any combination thereof. In an example the first heat exchanger interface comprises a liquid-air heat exchanger. In an example the at least one flow controlling element of the first cooling loop is configured to variably direct either none, some, or all of the first coolant to the first heat exchanger interface. In some examples, the management system utilizes at least one of a temperature of the at least one heat-generating electronic device (or the at least one computer server), the sensed coolant temperature, sensed ambient temperature, and catalogued periodic maximum temperature to adjust the flow controlling element. In an example the cooling system further comprises at least one cooling element that is configured to facilitate direct contact of the first coolant with a heat generating electronic device. In an example the first heat exchanger interface comprises a heat exchanger that is configured to interface with a waste heat recovery system.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the inventions. In the figures, identical or nearly identical components illustrated in various figures may be represented by a like reference character or numeral. For purposes of clarity, not every component may be labeled in every figure.

For a better understanding of the present disclosure, reference is made to the accompanying drawings in which:

FIG. 1 shows a graph of the maximum temperatures recorded in each continent, displaying the range of ambient temperatures that a data center may reject heat to.

DETAILED DESCRIPTION

Figure 1:
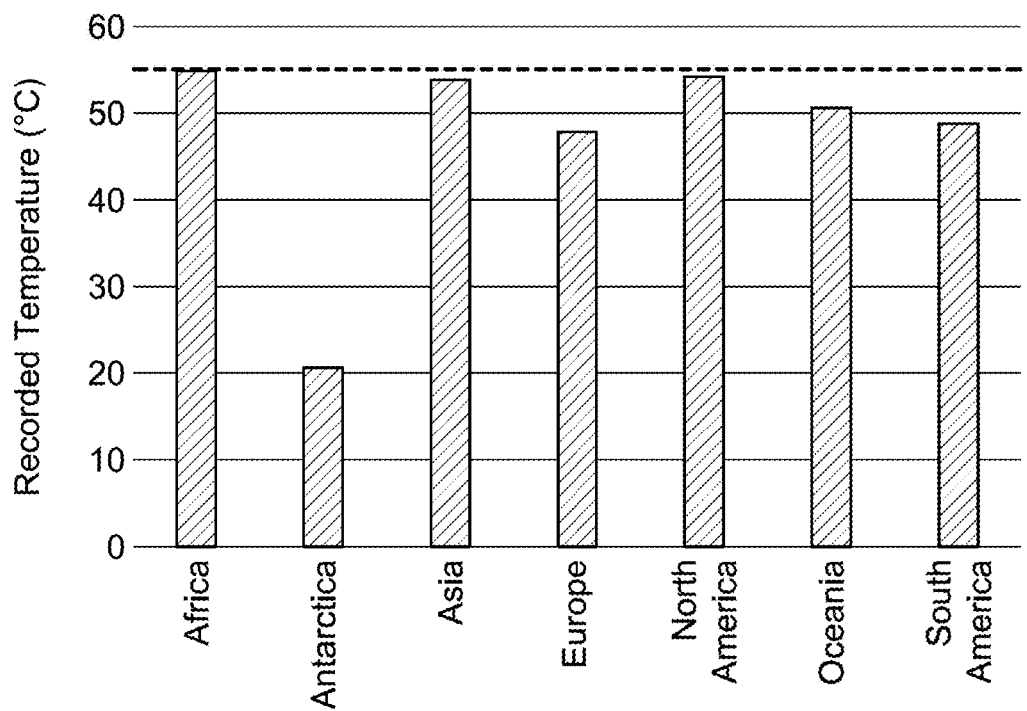

The following disclosure describes a high temperature electronic device thermal management system. Coolants are controlled by a management system and flow controlling elements to operate at elevated coolant temperatures, to enable low energy usage and high efficiency operation. In some examples described herein the heat-generating electronic devices are located in a data center. However, the present disclosure is not limited to thermal management of data centers, and can be applied to heat-generating electronic components more generally. Accordingly, discussion of data centers supports but does not limit the scope of the invention.

Examples of the systems, methods and apparatuses discussed herein are not limited in application to the details of construction and the arrangement of components set forth in the following description or illustrated in the accompanying drawings. The systems, methods and apparatuses are capable of implementation in other examples and of being practiced or of being carried out in various ways. Examples of specific implementations are provided herein for illustrative purposes only and are not intended to be limiting. In particular, functions, components, elements, and features discussed in connection with any one or more examples are not intended to be excluded from a similar role in any other examples.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

Also, the phraseology and terminology used herein is for the purpose of description and should not be regarded as limiting. Any references to examples, components, elements, acts, or functions of the computer program products, systems and methods herein referred to in the singular may also embrace embodiments including a plurality, and any references in plural to any example, component, element, act, or function herein may also embrace examples including only a singularity. Accordingly, references in the singular or plural form are not intended to limit the presently disclosed systems or methods, their components, acts, or elements. The use herein of "including," "comprising." "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Heat-generating electronic devices, such as CPUs, GPUs, artificial intelligence processors, and others, generate significant heat loads in their operation. For these devices to function properly, they must remain below a maximum operating temperature.

Most commonly, electronic devices are made out of silicon. Silicon is a semiconductor material, whose maximum temperature of operation is dictated by its lattice structure and material properties. Most often, silicon devices are recommended to operate at a device temperature at or below 100° C. for high-reliability, long-lifetime operation. There may be situations where operating at a different device temperature may be advantageous, such as around 85° C. or even 50° C., to have better reliability and lifetime characteristics, for example. In unique cases, silicon devices may operate at a device temperature up to, for example, 125° C., though this adds risk. Overall, device temperatures at or below 100° C. are preferred, and the absolute upper bound does not extend far above 100° C.

To sustain device temperatures below 100° C. the heat generated in electronic devices must be appropriately managed. To do this, a device must interact with a cooling fluid that has an inlet temperature that is lower than the device temperature. For example, an electronic device operating at 100° C. may interact with a gaseous coolant, such as air, at an inlet temperature of 10° C. In other cases, an electronic device operating at 100° C. may interact with a liquid coolant, such as water, glycol, water-glycol mix, dielectric fluid, or others, at an inlet temperature around 20° C. Liquid coolants tend to have better thermal transfer properties than gaseous coolants, generally allowing them to operate at higher inlet temperatures to achieve the same cooling effect. Regardless, the cooling fluid must be below the operating temperature of the device.

In such cases, the low inlet temperature cooling fluid takes heat from the electronic device. This results in the cooling fluid heating up, thereby causing a higher outlet temperature. An air system may increase from, for example, a 10° C. inlet temperature to a 50° C. outlet temperature. A liquid cooling system may increase, for example, from a 20° C. inlet temperature to a 30° C. outlet temperature.

For this to be a continuous process, the cooling fluid must be continually provided to the electronic device at the low inlet temperature. For example, re-using the air with a 50° C. outlet temperature without being cooled will not provide adequate cooling to the electronic device, resulting in overheating. This is to say, lower inlet temperature cooling fluids are more effective at removing heat from hot devices.

Sometimes, this is accomplished via a nominally open loop process. For example, air may be taken in from the ambient environment, cooled to a 10° C. inlet temperature via a heat exchanger, heated to a 50° C. outlet temperature during the cooling of the electronic device, and exhausted elsewhere to the environment.

In other situations, this may be a closed loop process. For example, a liquid coolant may have an inlet temperature of 20° C., be pumped in proximity to an electronic device, increase to 30° C. while cooling the device, be pumped away from the electronic device, and be cooled back to 20° C. via a heat exchanger. At this point the cycle is repeated, all in a continuous closed loop.

Importantly, coolants most commonly operate at inlet temperatures of 245° C. as defined by ASHRAE standards. This is to provide adequate cooling to the electronics, as lower temperature coolants provide better cooling to hot electronics. The inlet temperature is dependent on a number of factors, such as cooling fluid type, data center layout, device characteristics, and many others.

In locations and times of year with cold climates, the cooling fluid may be cooled to, for example, 2-45° C., by interacting with the ambient atmosphere. This may be done, for example, using cooling towers, thermosiphons, air-liquid heat exchangers, or other such ambient cooling infrastructure.

However, in many times of the year and in many locations on the planet, the ambient temperature goes above 2-45° C. FIG. 1 shows the high temperature recorded on each continent. Five out of seven continents eclipse 50° C., with Europe nearly reaching the mark as well. Only Antarctica has a high temperature in the range where certain data centers may be able to reject to the ambient environment in a continuous fashion. The highest mark, occurring in Africa, is 55° C.

Although these are high end values, it is a common occurrence for the cooling fluid to require cooling below ambient temperatures. This means, in many situations, the coolant must be cooled below ambient temperature to achieve the desired inlet coolant temperatures, and thereby sustain acceptable device temperatures.

It is worth noting that these reported temperatures are "dry-bulb" ambient temperature values. This represents the temperature at which heat can be rejected to the ambient environment without the use of evaporative cooling. There is also the "wet-bulb" temperature, which represents the temperature that can be achieved via evaporation in the ambient atmosphere. It is acknowledged that sub "dry-bulb" ambient temperatures can be achieved by use of evaporation, down to the "wet-bulb" temperature, whose difference depends on the water content of the air.

While this has advantages of being able to achieve lower temperatures, evaporative cooling does not come without disadvantages. It often results in increased water and/or energy usage, as the water provided for evaporation is often difficult or energy intensive to re-capture, and may not be ubiquitously available in all environments. In this disclosure, the term "ambient" may be interpreted as either "dry-bulb" or "wet-bulb" temperature as is applicable. Those skilled in the art understand the methodology used for cooling to the ambient environment is highly situational, and the distinction does not change the essence of the invention.

To achieve sub-ambient temperature operation, a refrigeration cycle is used. Refrigeration cycles operate with a coolant whose state of matter alternates between liquid and gas (vapor) as it travels through the cycle. Such coolants are aptly named refrigerants, such as, for example, R-134a. The refrigeration cycle is administered because the boiling point of a refrigerant can be controlled by changing its pressure, at which point the latent heat of vaporization can be used to reject heat. Therefore, by choosing a pressure corresponding to a temperature below ambient, the multiphase coolant can serve as a heat sink at the sub-ambient temperature until it fully evaporates.

While this configuration offers high utility in offering precise sub-ambient temperature control, the cost is additional energy. There is an input energy penalty associated with the pressure change of the refrigerant, which does not exist in direct-to-ambient cooling systems.

The laws of thermodynamics dictate two major drawbacks when employing a refrigeration cycle in data center cooling systems: first, that more energy must be provided the further below ambient the refrigerant is chilled; and second, that the energy efficiency of the refrigeration cycle decreases the further below ambient the refrigerant is chilled. Each incremental decrease in temperature requires increasingly more energy to chill the refrigerant.

Thus, the upcoming set of figures will describe some common configurations of current data center thermal system configurations as prior art. The figures that follow will introduce the invention in the context of this prior art, in various embodiments.

Figure 2:
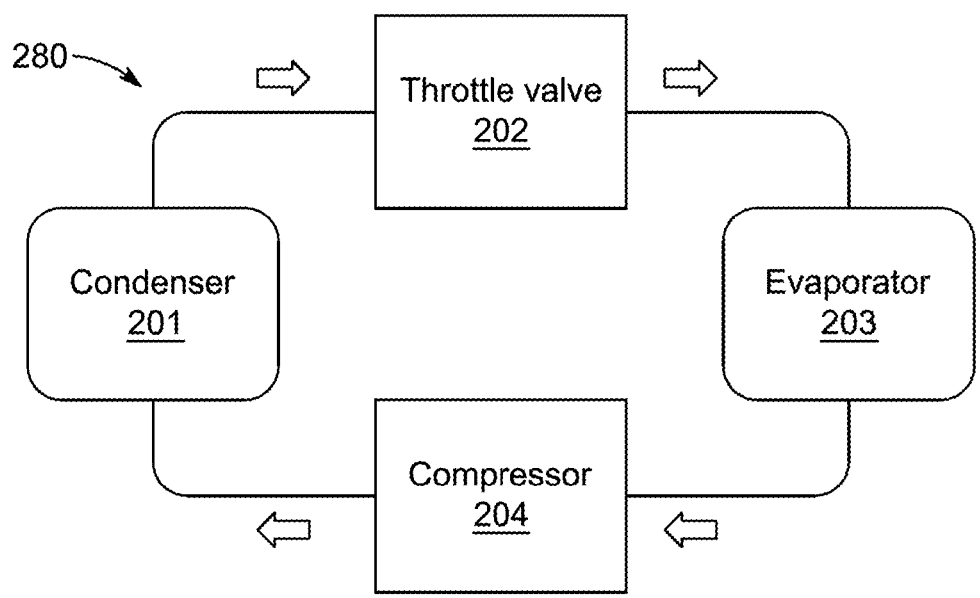
FIG. 2 shows a prior art embodiment of a refrigeration cycle, the baseline system required to achieve sub-ambient coolant temperatures for cooling of data centers.

FIG. 2 shows a schematic of a prior art embodiment of a refrigeration cycle. The refrigerant 280 is contained in a refrigeration loop containing a condenser 201, a throttle valve 202, an evaporator 203, and a compressor 204. Beginning arbitrarily at the outlet of the condenser 201, the refrigerant is liquid phase at high pressure. The throttle valve 202 lowers the pressure of the refrigerant. In this expansion phase, the refrigerant often lowers its temperature in a near isenthalpic fashion. The refrigerant then enters the evaporator 203, where it accepts heat to gradually convert from liquid to gas, all at a constant sub-ambient temperature. The vapor exiting the evaporator 203 then enters the compressor 204, which raises the pressure of the refrigerant 280. In this compression phase, the refrigerant often increases its temperature in a near isentropic fashion. The refrigerant finishes the loop by going through the condenser 201, returning the refrigerant to a liquid phase at high pressure, to continue carrying out the loop in a steady state fashion.

Figure 3:
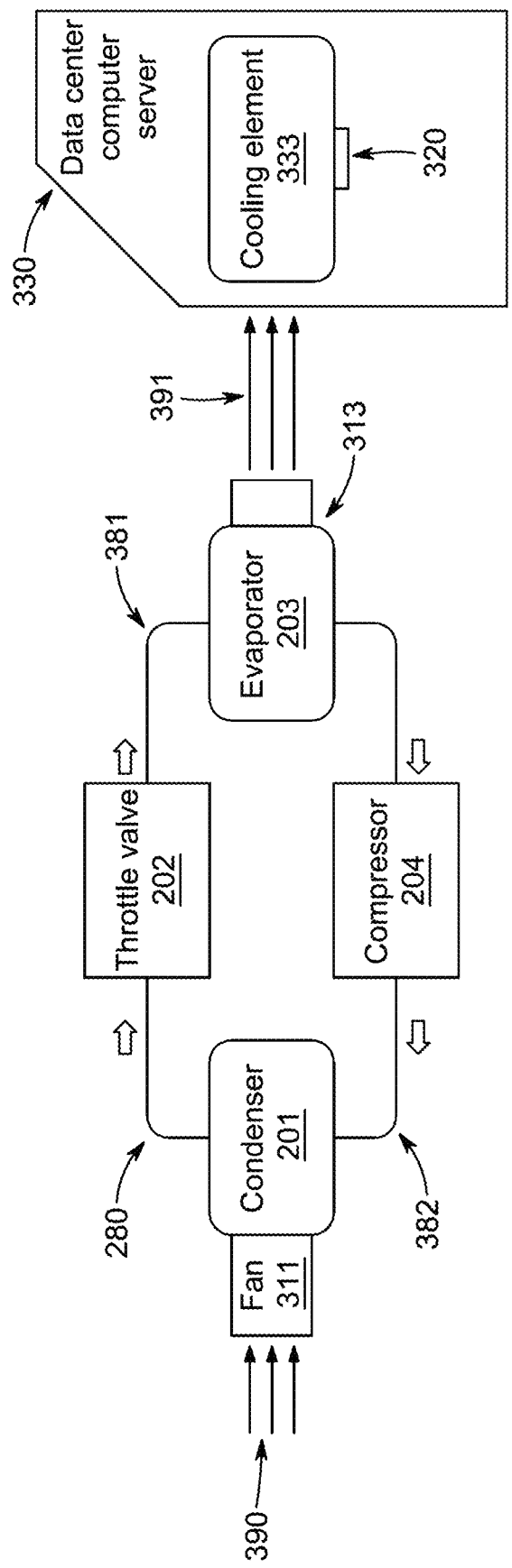
FIG. 3 shows a prior art embodiment of a data center thermal management system, where the refrigeration loop exchanges heat with air at its evaporator to provide cooling to a heat-generating element in a data center computer server, and exchanges heat with air at its condenser to reject heat to the ambient environment.

This fundamental refrigeration process is used in different embodiments across thermal management systems. FIG. 3 shows a system where the refrigeration cycle exchanges heat with air at both the condenser and the evaporator, forming a cooling loop. Beginning arbitrarily at the outlet of the condenser 201, the refrigerant 280 is fully liquid phase at high pressure. The throttle valve 202 lowers the pressure of the refrigerant. In this expansion phase, the refrigerant often lowers its temperature in a near isenthalpic fashion. The refrigerant in state 381 then enters the evaporator 203, where a fan or blower 313 causes an air stream 391 to pass over the evaporator 203. The air 391 exchanges heat with refrigerant 280 in the evaporator 203, allowing for the air stream 391 to be chilled below ambient temperature while the heat from the air evaporates the refrigerant 280.

Meanwhile, the air stream 391 leaves the evaporator and interacts with a cooling element 333, which is attached to a heat generating element 320 of a data center computer server 330. The cooling element 203 facilitates cooling between the air stream 391 and the heat generating element 320, and may be, for example, a metal finned heat sink, a metal finned heat pipe, or other similar cooling elements known by those skilled in the art. The air stream 391 provides cooling to the heat generating element 320 by way of the cooling element 333, causing the air stream 391 to raise in temperature.

Continuing in the refrigeration loop, the refrigerant 280 has changed phase into low temperature vapor by accepting the heat from air stream 391, and its pressure is raised in the compressor 204 and reaches vapor state 382. In this compression phase, the refrigerant often increases its temperature in a near isentropic fashion. The refrigerant finishes the loop by going through the condenser 201, where a fan or blower 311 causes a separate air stream 390 to flow over the condenser 201. In a similar yet opposite process of the evaporator, the air stream 390 now accepts heat from the condenser 201 to condense the refrigerant 280 from vapor to liquid. Note that as a result of the compression phase in the compressor 204, the temperature of the refrigerant 280 had raised above ambient temperature, allowing it to give its heat off to air stream 390 whose temperature often matches the ambient temperature.

This process demonstrates the mechanism of the refrigeration cycle in the cooling of a computer server. By changing the pressure of the refrigerant 280, its boiling temperature adjusts, and allows for a constant temperature heat rejection process below ambient temperature at the evaporator 203 and above ambient temperature at the condenser 201.

Notably, this process is made possible by the energy input to the compressor 204 to facilitate the change in boiling temperature of the refrigerant 280. The compressor 204 receives energy to pressurize the refrigerant 280 such that its boiling temperature has raised above that of ambient temperature, allowing it to reject to ambient temperature. Meanwhile, the pressure is reduced before entering the evaporator 203 to achieve sub-ambient temperature heat rejection, but must be raised back up for the refrigeration cycle to persist at steady state.

As an illustrative but non-specific and non-bounding example, air stream 390 may be at an ambient temperature of, for example, 30° C. Refrigerant 280, in its state 381 entering the evaporator 203, may be in a liquid phase at, for example, 10° C. As air stream 391 deposits its heat into the refrigerant 280 via the evaporator 203, it achieves a temperature at or close to the temperature of refrigerant state 381 of, for example, 10° C., while causing the refrigerant 280 to evaporate. Air stream 391 at 10° C. exchanges heat with heat generating element 320 at a device temperature of, for example 100° C., causing the air stream 391 to increase in temperature up to, for example, 50° C. Meanwhile, after the refrigerant 280 becomes vapor in the evaporator and goes through the compressor, it reaches state 382 of a vapor phase at, for example, 40° C. Then, air stream 390 at ambient temperature of, for example, 30° C., can accept heat from the refrigerant 280 via the condenser 201, causing the refrigerant to condense and continue the cycle.

FIG. 3 depicts a fundamental prior art of data center cooling. Although administered in various configurations, the refrigeration cycle with heat exchange mechanisms at the evaporator and condenser allow for sub-ambient cooling.

Figure 4:
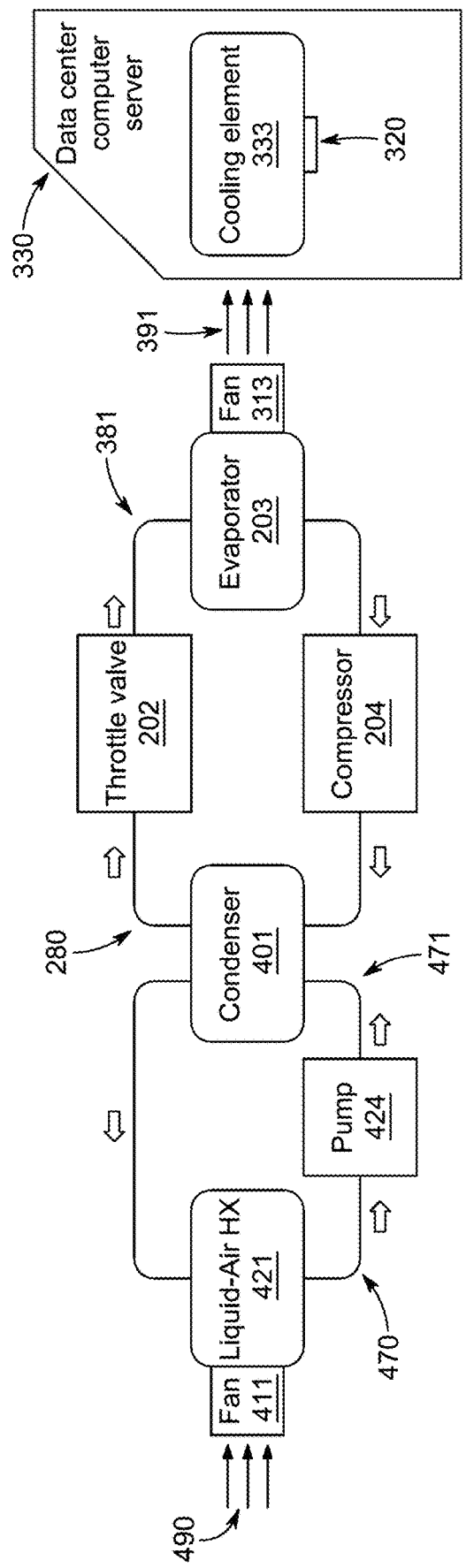
FIG. 4 shows another prior art embodiment of a data center thermal management system, where the refrigeration loop exchanges heat with air at its evaporator to provide cooling to a heat-generating element in a data center computer server, and with a liquid coolant at its condenser, where said liquid coolant then exchanges heat with air at a heat exchanger to reject heat to the ambient environment.

FIG. 4 shows another prior art embodiment of the refrigeration cycle. The refrigeration cycle and device cooling mechanism operate equivalently to those depicted in FIG. 3, except for a different method of heat exchange at the condenser. In FIG. 4, The condenser 401 is also part of a second cooling loop, which uses a single-phase liquid cooling loop instead of a multi-phase refrigerant cooling loop. The single-phase liquid cooling loop comprises a liquid coolant 470, a heat exchanger 421, a pump 424, and a condenser 401. In this case, the condenser 401 is not air cooled, but rather liquid cooled. Beginning arbitrarily after the heat exchanger 421, a pump 424 causes liquid coolant 470 to flow by raising its pressure into state 471. It enters the condenser 401 and accepts heat from the refrigerant 280 from the refrigeration cooling loop, causing the refrigerant 280 to condense back into liquid. The liquid coolant 470 increases in temperature through the condenser 401. It exits the condenser 401 and then enters the heat exchanger 421, which is cooled by the ambient environment. A fan or blower 411 causes air stream 490 to pass over or through heat exchanger 421, removing heat from the liquid coolant 470 to continue the loop.

The heat exchanger 421 may take on many forms. It may be a liquid-air heat exchanger, or dry cooling tower, where the air stream 490 does not come in direct contact with the liquid coolant 470, but rather exchanges heat by way of convection on, for example, a metal finned heat exchanger geometry. Heat exchanger 421 may also be an open circuit cooling tower, where liquid coolant 470 is exposed to the ambient air stream 490, causing cooling by way of direct contact and/or evaporative cooling. It may also be a closed circuit cooling tower, where a separate liquid coolant is sprayed or entrained in air stream 490, which removes heat via convection and/or evaporation from liquid coolant 470 through, for example, a metal heat exchanger geometry. Heat exchanger 421 may also be a thermosiphon, which rejects heat to the atmosphere by a gravity driven cooling loop which may or may not contain change of phase. Hybrids of these heat exchangers options, or other versions of heat exchanger 421, are of course possible.

Figure 5:
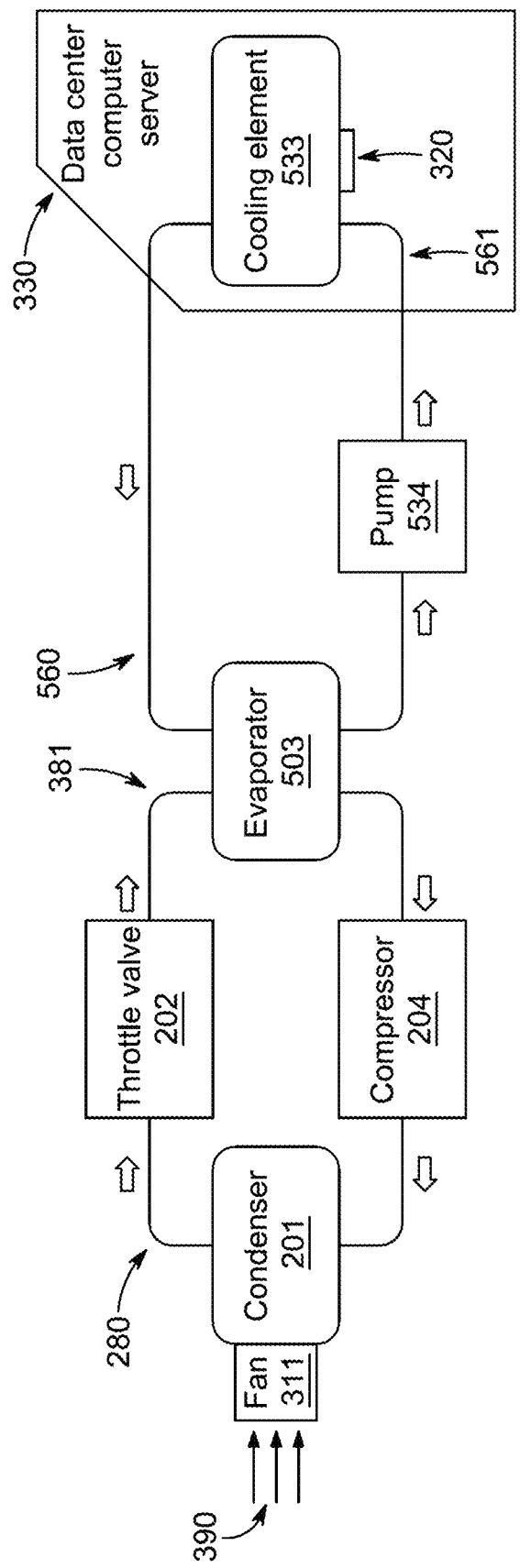
FIG. 5 shows another prior art embodiment of a data center thermal management system, where the refrigeration loop exchanges heat with a liquid coolant at its evaporator where the liquid coolant provides cooling to a heat-generating element in a data center computer server, and exchanges heat with air at its condenser to reject heat to the ambient environment.

FIG. 5 shows yet another prior art embodiment of a data center cooling configuration with a refrigeration cycle. In this prior art embodiment, the refrigeration cycle is unchanged except at the evaporator interface, where a single-phase liquid cooling loop is used instead of air for device cooling. The single-phase liquid cooling loop comprises a liquid coolant 560, an evaporator 503, a pump 534, and a cooling element 533. Starting arbitrarily after the evaporator 503, a pump 534 causes single-phase liquid coolant 560 to flow by raising its pressure. It enters the cooling element 533, removes heat from heat-generating element 320 of data center computer server 330. The liquid coolant 560 raises its temperature as it accepts heat from heat-generating element 320, maintaining the temperature of the heat-generating element below a maximum device temperature. The liquid coolant returns to evaporator 503, where it gives off its heat to cause refrigerant 280 to boil. This causes the coolant to achieve a sub-ambient temperature at state 561 to provide cooling to heat-generating element 320, nearly matching the sub-ambient temperature at state 381 of the refrigerant 280 as part of the refrigeration loop. In this case, like in FIG. 3, the refrigerant condenser exchanges heat with ambient air stream 390, but requires input energy at the compressor 204 to achieve sub-ambient temperature operation at state 381.

There are many configurations of data center thermal management systems in prior art, not limited to those shown here. Such thermal management systems and components may take on various names, such as computer room air conditioner (CRAC), computer room air handler (CRAH), chilled water, chilled glycol, chiller, pumped refrigerant, cooling tower, direct evaporative, indirect evaporative, rooftop, and other systems. However, those skilled in the art know that systems employing sub-ambient cooling utilize a cycle involving a refrigerant changing phase, with various permutations containing one or more liquid or air systems interfacing with the evaporator and condenser heat exchangers. Changing the phase of a refrigerant is an energy-intensive operation.

The following describes examples of the present high temperature electronic device thermal management system.

Figure 6:
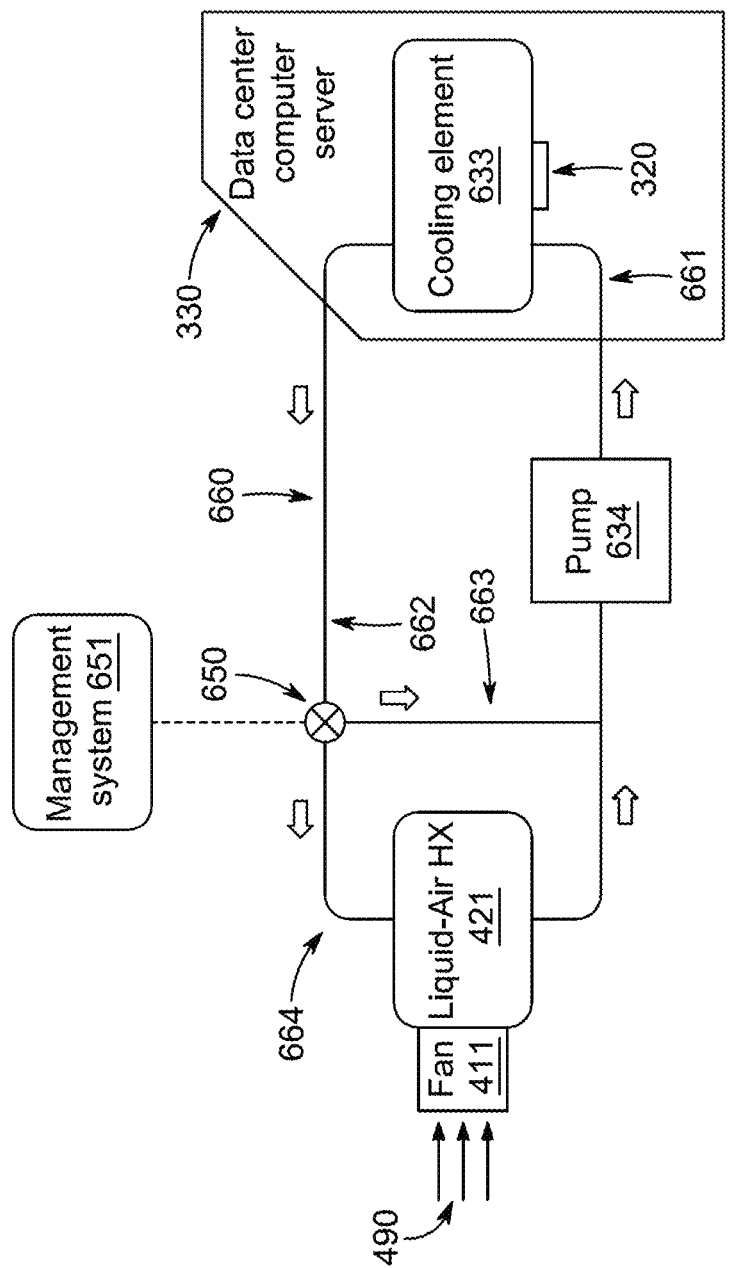
FIG. 6 shows an embodiment of a high temperature thermal management system of the present disclosure, where a management system and flow controlling elements adjust the flow rate of coolant to sustain elevated coolant temperatures while providing cooling to a heat-generating element in a computer server.

FIG. 6 shows one embodiment of a high temperature electronic device (e.g., data center) thermal management system containing a management system and flow controlling elements for elevating coolant temperature. The high temperature data center thermal management system includes a coolant 660, a pump 634, a high-thermal-conductance cooling element 633, and a liquid-air heat exchanger 421. Often, the coolant 660 will be a liquid coolant, such as, for example, water or a water-glycol mixture. Beginning arbitrarily at the inlet of the pump 634, the pump 634 causes the liquid coolant 660 to flow by raising its pressure into state 661. The liquid coolant enters high-thermal-conductance cooling element 633 and accepts heat from heat-generating element 320 in data center computer server 330. This causes the liquid coolant 660 to raise in temperature, keeping the heat-generating element 320 at or below its maximum operating temperature.

The liquid coolant 660 is then sensed and controlled by a management system to enforce an elevated temperature for low energy usage. Management system 651 senses the coolant temperature at state 662. Management system 651 also senses the ambient air temperature, such as the dry bulb or wet bulb temperature of the data center's outdoor surroundings, or perhaps of air stream 490 being supplied to fan 411. Air stream 490 typically originates from outside the data center building, but it may originate from just inside of the data center building depending on the data center air management system configuration. Management system 651 also catalogues the periodic (e.g., annual) maximum ambient temperature. In some examples this maximum ambient temperature is measured by an aspect of the subject cooling system, or by the data center operator. In other examples the maximum ambient temperature may be retrieved from temperature records kept by third parties and available for use in the subject cooling system. In an example the periodic maximum ambient temperature is taken from publicly-available weather data, such as the maximum recorded annual temperature in a geographic region that includes the data center. Using these temperatures, and potentially other measurements and preferred settings, the management system 651 sends a signal to flow controlling element 650 (further explained below, and which in an example is a valve) to adjust the flow rate of the system. The flow rate adjustments act to elevate the coolant temperature to enable a low energy usage data center thermal management system, thereby obviating the need for refrigeration cycles or sub-ambient cooling.

For example, in one set of circumstances, the management system 651 may send a signal to flow controlling element 650 to bypass all of the flow back to the inlet of pump 634 along path 663. As coolant would re-circulate through the system and provide cooling for heat generating element 320, this would serve to continually elevate the temperature of coolant 660 until a desired elevated coolant temperature is reached, as determined by the management system 651.

In another set of circumstances, the coolant may be at an adequately elevated temperature given the ambient temperature or catalogued maximum annual temperature, at which point the management system 651 may send a signal to flow controlling element 650 to divert all of the flow to liquid-air heat exchanger 421 along path 664. As coolant passes through liquid-air heat exchanger 421, fan 411 causes air stream 490 at ambient temperature to remove heat from liquid coolant 660, this time before passing through the pump and continuing to provide cooling for heat generating element 320.

Other intermediate sets of circumstances of course exist, where the flow is split such that some of liquid coolant 662 bypasses back to the pump along path 663, and some is passed through the liquid air heat exchanger 421 along path 664 to achieve a desired elevated coolant temperature. Importantly, in some embodiments, the management system 651 may utilize at least one of a temperature of the heat-generating device 320, the sensed coolant temperature, sensed ambient temperature, and catalogued annual maximum temperature to adjust the flow controlling element 650 so as to adjust the flow rate and achieve a desired elevated coolant temperature. That is, the management system 651 may utilize a control algorithm that implements at least one of the temperature of the heat-generating device 320, the sensed coolant temperature, sensed ambient temperature, and catalogued annual maximum temperature to adjust the flow controlling element 650 so as to adjust the flow rate and achieve a desired elevated coolant temperature. In embodiments in which the control algorithm implements the temperature of the heat-generating device 320, the management system 651 can sense the temperature of the heat-generating device 320, or the data center computer server 330 can include components to sense the temperature of the heat-generating device 320 and can provide the sensed temperature of the heat-generating device 320 to the management system 651.

Further, in some embodiments, the management system 651 may utilize a control algorithm that implements at least one of a temperature of the data center computer server 330, the sensed coolant temperature, sensed ambient temperature, and catalogued annual maximum temperature to adjust the flow controlling element 650 so as to adjust the flow rate and achieve a desired elevated coolant temperature. In embodiments in which the control algorithm implements the temperature of the data center computer server 330, the management system 651 can sense the temperature of the data center computer server 330, or the data center computer server 330 can include components to sense the temperature of the data center computer server 330 and can provide the sensed temperature of the data center computer server 330 to the management system 651.

In some embodiments, the control algorithm for the flow controlling element 650 may implement the temperature of the heat-generating device 320 or the data center computer server 330, without implementing other temperatures. In some embodiments, the control algorithm for the flow controlling element 650 may implement the sensed coolant temperature, without implementing other temperatures. According to some embodiments, the control algorithm for the flow controlling element 650 may implement the sensed coolant temperature and the temperature of the heat-generating device 320 or the data center computer server 330, without implementing other temperatures. According to some embodiments, the control algorithm for the flow controlling element 650 may implement the sensed coolant temperature, the temperature of the heat-generating device 320 or the data center computer server 330, and at least one of the sensed ambient temperature and the catalogued annual maximum temperature. In some embodiments, the control algorithm for the flow controlling element 650 may implement the temperature of the heat-generating device 320 or the data center computer server 330, and at least one of the sensed ambient temperature and the catalogued annual maximum temperature. Further, according to some embodiments, the control algorithm for the flow controlling element 650 may implement the temperature of the heat-generating device 320 or the data center computer server 330, the sensed coolant temperature, sensed ambient temperature, and the catalogued annual maximum temperature.

In one embodiment, the management system 651 may dictate that the coolant temperature of coolant 660 remains above the measured ambient temperature. This is helpful in reducing energy usage as refrigeration cycles need not be used, and therefore energy is saved by not needing to use the compressor. The ambient temperature during some times of year may be as low as, for example, 5° C., at which point the coolant may be able to sustain a temperature of, for example, 10° C., without using refrigeration cycles. This is a low energy configuration despite the low coolant temperature. In other times of year, the ambient temperature may be much higher, such as, for example 35° C., at which point the coolant would still raise above ambient, say 40° C., for example. This configuration is advantageous to sustain low energy usage at all times of year, while also providing the heat generating elements the lowest possible temperature coolant. Therefore, during the coldest times of year, additional computations by the cooled data center processors may be sustainable, for example.

In another embodiment, the management system 651 may dictate that the coolant temperature of coolant 660 remains above the annual maximum ambient temperature, as catalogued by management system 651. This is helpful in that it guarantees a low energy usage system year-round without highly resolved tracking of the ambient temperature. It is also helpful in selecting an ideal set of materials that are optimized for use around the annual maximum ambient temperature of a given climate, which may call for less maintenance and longer data center lifetime. For example, thermal cycling is a common design consideration for high longevity cooling systems. When subject to frequent and/or numerous temperature swings, mating mechanical parts may be chosen to have very closely matched coefficients of thermal expansion so as to reduce stress on adjoining components such as fasteners, adhesives, welds, or solders. Furthermore, certain adjoining materials such as elastomeric gaskets are formed from different materials that are recommended for optimal use at different temperatures (e.g. Viton may be recommended for higher temperature use over Buna). Therefore, by sustaining a certain coolant temperature, material optimization can be completed in the design phase and thereby cause less frequent maintenance for components such as gaskets.

It may also save additional energy, as often ambient heat exchangers rely on fans to remove heat, at which point a greater delta between the elevated coolant temperature and the ambient temperature would require reduced fan power during times of year when temperatures are low. For example, in Europe, as seen in FIG. 1, the annual maximum temperature may be around 48° C. Therefore, management system 651 may dictate that the coolant remains at 50° C. at all times of year. In the hottest times of year when the ambient temperature is 48° C., the data center cooling system will be low energy usage by exchanging heat with ambient air. Meanwhile, in the coolest times of year when the ambient temperature is much lower, say for example 10° C., the coolant at 50° C. will have a much bigger temperature gradient with the 10° C. air, and therefore require less fan power to sustain the 50° C. coolant temperature.

In yet another embodiment, the management system 651 may dictate that the coolant temperature of coolant 660 remains above 55° C. at all times. This provides all of the advantages of the annual maximum ambient temperature of a given area, but is guaranteed to be, for example, globally compatible, as dictated in FIG. 1. This may be helpful in simplifying data center operations globally, as optimized materials can be chosen for a single coolant temperature for less maintenance and long data center lifetimes. Similarly, a data center with coolant operating above 55° C. may be extremely low energy usage during cold times of year by reducing fan power required for ambient cooling. Additionally, it may be helpful to standardize data center operations, such that remote data center operators could very simply understand the operation of distributed data centers worldwide, as the coolant temperatures would all refer back to the 55° C. baseline as dictated by management system 651.

FIG. 6 represents only one possible embodiment of the layout of the management system 651 and the flow controlling element 650. Flow controlling element 650 may consist of valves, thermostats, manifolds, or other such hardware dedicated to adjusting flow rates through data center coolant loops (e.g., by diverting some or all of the flow as described above). Note that although flow controlling element 650 is designated in only one location in FIG. 6, it may be implemented as a distributed system of individual elements to collectively form a system of flow controlling elements 650 throughout the various cooling loops.

The management system 651 may also be implemented in various forms. For example, it may comprise a programmed processor and associated memory. The signals to and from the coolant and flow controlling elements may be routed to a central control center, which may be co-located with a safety control system or dashboard, to centrally adjust the flow rate of the coolant loops. Other implementations may involve distributed control nodes which may or may not communicate with different nodes in the system, thereby providing local flow rate adjustments to individual flow branches or heat generating elements. The management system 651 will vary across data centers, depending on the operational staffing resources, system complexity, hardware availability, and variety of operational states.

As we have seen in FIG. 1, ambient temperatures reach high temperatures, well above 45° C., or even above 50° C., for example. Temperatures have been recorded up to 55° C. With the management system 651, the temperature at state 661 will at certain times necessarily be at or above these high temperatures. Specifically, the coolant temperature may well be at or above 55° C.

Typically, as has been discussed at length in this disclosure, cooling fluids in data centers operate between 2-45° C. This is typically required to sustain safe device temperatures, for example, at or below 100° C. for silicon devices.

Figure 7:
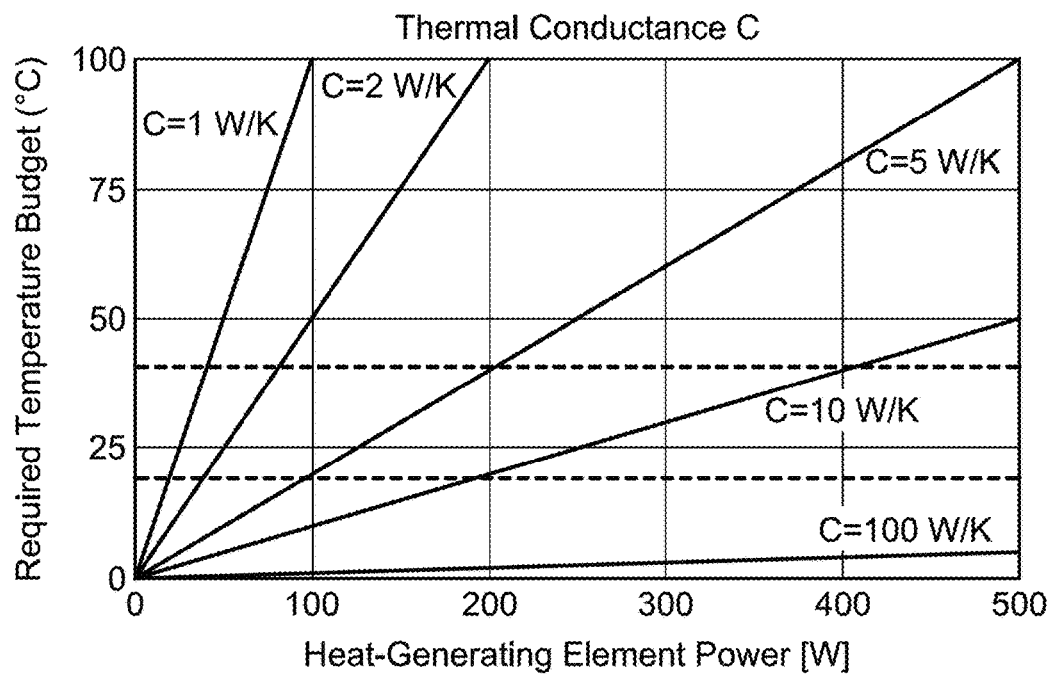
FIG. 7 shows a plot of the thermal conductance required for various combinations of coolant temperature, device temperature, and device power level as required by high temperature thermal management systems of the present disclosure.

Therefore, the high-thermal-conductance cooling element 633 can be a necessary or helpful component in the high temperature thermal management system. FIG. 7 shows a graph of the temperature budget required to achieve adequate cooling against the power of the heat generating element at various cooling element thermal conductances. As obvious to those skilled in the art, high power heat-generating elements benefit from larger temperature deltas between the coolant and the device to sustain device temperatures below the maximum allowable. Further, a cooling element with a higher thermal conductance, or equivalently stated, a lower thermal resistance, will allow for higher power devices at lower temperature delta budgets.

For example, dashed line 701 represents a 40° C. delta from coolant to device temperature. This may represent the example of a 100° C. device operating temperature, and a 60° C. coolant temperature. For a 200 W heat-generating element, this may require a cooling element with a thermal conductance of 5 W/K.

Dashed line 702 represents a 20° C. delta from coolant to device temperature. This may represent a situation where, for example, multiple heat-generating elements are placed in a cooling loop sequentially. Therefore, the outlet liquid coolant temperature of one heat-generating device is the inlet cooling temperature of the subsequent heat-generating device. Given the same flow, thermal conductance, and device power across each sequential device, the thermal conductance on the final device of the sequence, for example, must fulfill the worst-case scenario. For a 200 W heat-generating element operating at a 20° C. delta indicated by dashed line 702, the system may require a cooling element with a thermal conductance of 10 W/K.

Therefore, a variety of inter-related factors, such as device architecture, system architecture, device operational state, and many others, influence the precise requirement of the high-thermal-conductance cooling element 633. This disclosure contemplates building a system containing appropriately selected high-thermal-conductance cooling elements 633 able to sustain the temperature of the heat-generating elements 320 below their maximum operating temperatures by use of coolants at elevated temperatures, such as those at or above 55° C., as governed by the management system 651.

High-thermal-conductance cooling elements 633 may take on many forms. For example, high-thermal-conductance cooling element 633 may involve a very high heat transfer coefficient flow configuration, such as those achieved by microchannel or microjet cooling. High-thermal-conductance cooling element 633 may also involve a very high area enhancement factor, such as surface texturing, fins, channels, or other such area enhancement techniques. High-thermal-conductance cooling element 633 may use a combination of high heat transfer coefficient flow configurations and high area enhancement factors.

High-thermal-conductance cooling element 633 may also be configured in such a way that minimizes the number of layers between the coolant and the heat generation location on the heat-generating device 320. For example, layers of metal, thermal interface materials, filler materials, epoxy materials, lids, and many other layers may reduce the conductance of the cooling element between the coolant and the heat-generating portion of the device.

For example, in many computer servers 330, there exists the heat generating element 320, which may consist of, for example, a semiconductor chip (die) where heat is being generated, a TIM 1 thermal interface material, a metal lid, a TIM 2 thermal interface material, a thickness of metal forming part of a cooling plate, before finally reaching a flow of coolant.

A high-thermal-conductance cooling element 633 may be administered so as to remove, for example, the TIM 2 material and the thickness of metal of a cooling plate, to provide more direct access of the coolant to the heat-generating element 320 and therefore achieve a high thermal conductance.

As another example, a high-thermal-conductance cooling element 633 may be administered so as to remove, for example, the TIM 1 material, the lid, the TIM 2 material, and the thickness of metal of a cooling plate, to provide even more direct access of the coolant to the heat-generating element 320 and therefore achieve a high thermal conductance.

Heat-generating elements 320 may be a large variety of devices, but may in certain cases be central processing units, graphical processing units, machine learning chips, artificial intelligence chips, or any other device that requires cooling.

In short, FIG. 6 displays an embodiment of a data center thermal management system able to operate using coolants with elevated coolant temperatures as governed by management system 651, whose high-thermal-conductance cooling element 633 is dictated by tradeoffs in FIG. 7 as well as many inter-related factors such as device and system operation, while allowing for heat-generating element 320 of data center computer server 330 to remain below its maximum operating temperature.

Traditional data center cooling systems often follow the guidelines provided by ASHRAE (American Society of Heating, Refrigerating. and Air Conditioning Engineers). In 2011, ASHRAE established thermal guidelines for liquid cooled data processing environments. These guidelines consisted of five zones of categorizing liquid coolant temperatures, with the highest temperature category being defined at or above 45° C. This invention contemplates cooling temperatures up to 55° C. therefore departs significantly from traditional guidelines, enabled by the high-thermal-conductance cooling element 633 and management system 651 for low energy usage.

Figure 8:
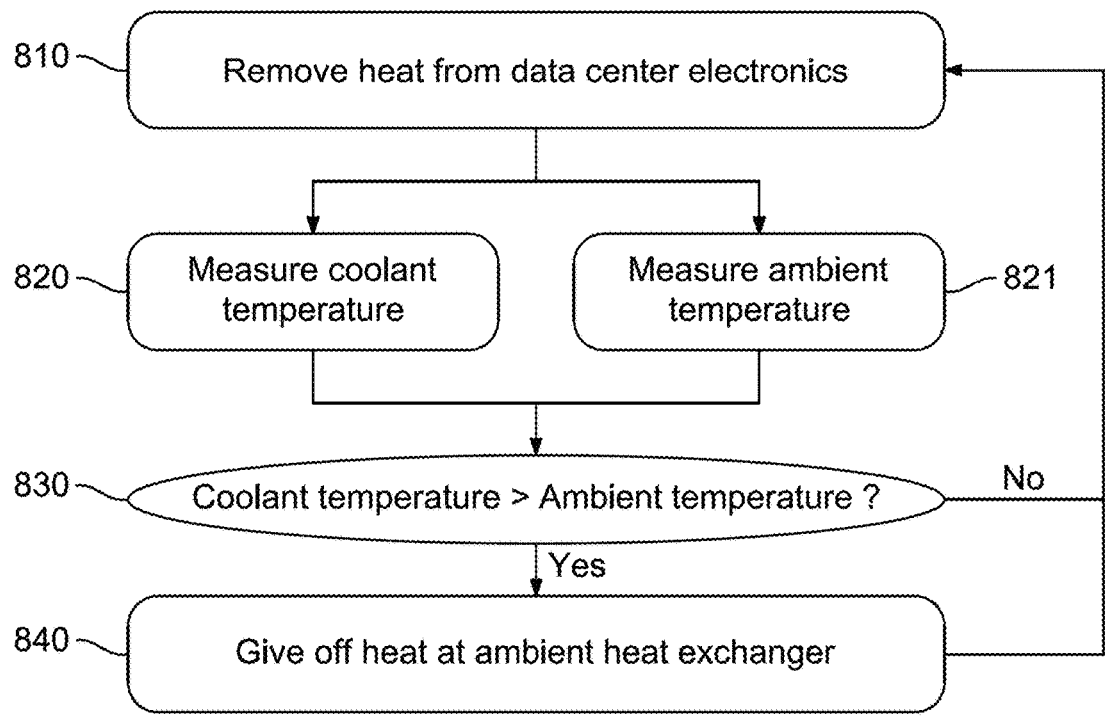
FIG. 8 shows a flow diagram outlining an example procedure implemented by the present flow management system to sustain elevated coolant temperatures in a high temperature thermal management system.

FIG. 8 shows an example flow diagram for the operation of the management system 651 that may be used in an embodiment of a high temperature electronic device thermal management system. Flow chart step 810 begins, arbitrarily, with a coolant removing heat from a heat-generating element of a data center computer server. In steps 820 and 821, the management system 651 may sense the coolant temperature and ambient temperature to adjust flow controlling element 650 to elevate coolant temperature. If the sensed temperature is below ambient, for example, the liquid coolant 660 may be diverted via flow controlling element 650 to elevate the coolant temperature. If the sensed temperature is, for example, above ambient, the coolant may pass through the liquid-air heat exchanger 421 to reject heat to the ambient environment.

Other flow management and flow diverting configurations are also possible. Currently, many data center operators may switch between ambient heat exchanger types depending on the ambient temperature. In a yearly cycle, a cooling tower or thermosiphon may be used when it is cool enough outside to maintain IT equipment temperature using free or passive cooling, while active cooling such as refrigeration may be used when it is too warm (e.g. above a certain threshold temperature). Instead of serving as a bypass, the flow management system may use the sensed and/or yearly annual temperatures to divert flow between a refrigeration loop and a passive thermosiphon, for example. In many places, the present disclosure may allow for the use of a passive thermosiphon year-round. For example, if the management system catalogues a yearly annual temperature that falls below the required coolant temperature for maintaining IT equipment at a safe operating temperature, the flow management system can be configured to divert coolant to the passive cooler year round, making for very low energy data center operation. Note that by the physical operating principles of passive coolers, the coolant temperature will remain at or above the ambient temperature when exchanging heat. Other configurations are of course possible.

Other adjustments to the data center, such as material choices, pressures, flow rates, data center layouts, and others, may also of course be needed to accommodate the higher temperature coolant flow.

Similar to the various prior art embodiments of refrigeration cycle data center configurations, there may be a variety of embodiments of the high temperature data center thermal management system.

Figure 9:
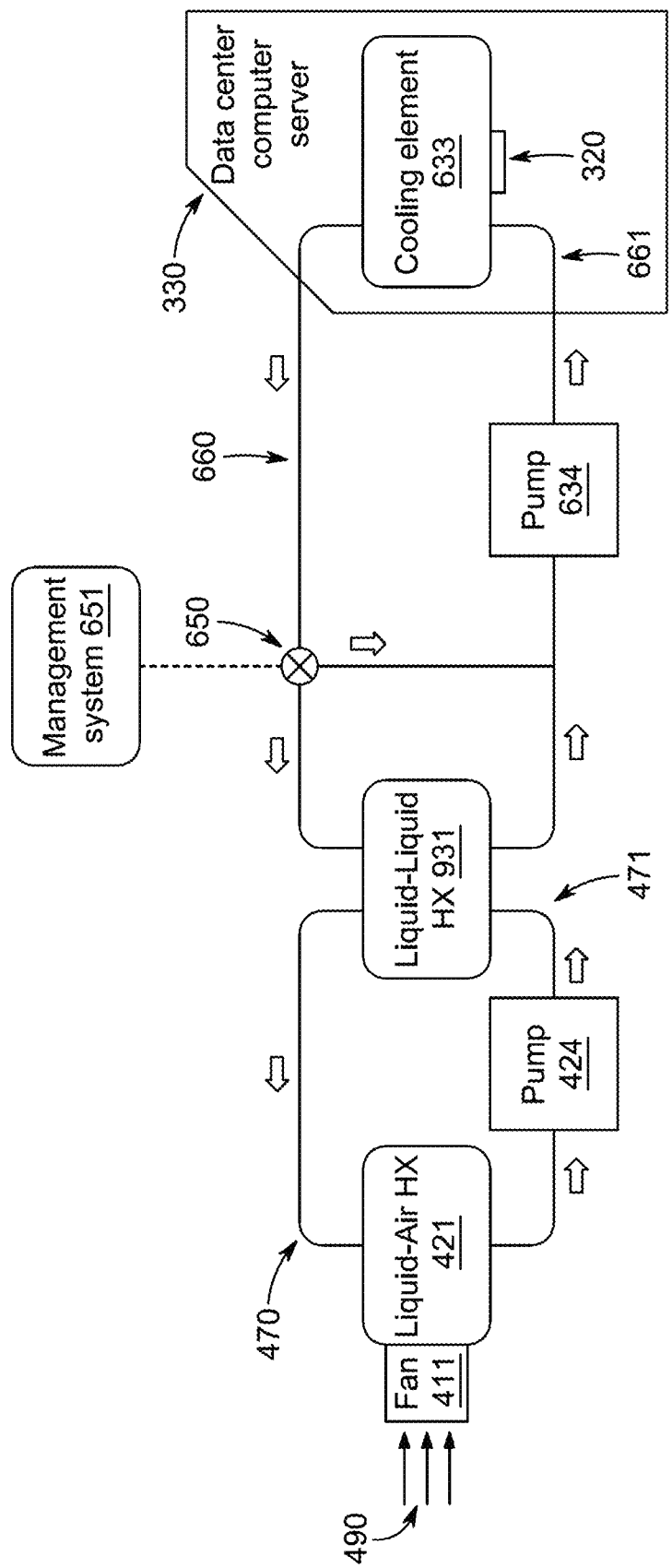
FIG. 9 shows another embodiment of a high temperature thermal management system of the present disclosure, where a liquid coolant provides cooling to a heat-generating element in a data center computer server, and exchanges heat with a second liquid coolant at a heat exchanger, in which the second liquid coolant exchanges heat with air at a heat exchanger to reject heat to the ambient environment.

FIG. 9 shows another embodiment, where there may be an auxiliary cooling loop containing liquid coolant 470 acting as an intermediary to transport heat from liquid coolant 660 to the air stream 490 at ambient temperature. The cooling loop providing cooling to the data center computer server remains unchanged, except that its heat exchanger 931 is a liquid-liquid heat exchanger to transfer the heat into the intermediate loop and coolant 470 instead of directly into air. The liquid cooling loop with liquid coolant 470 acts in an equivalent fashion as that shown in FIG. 5, except in this case it rejects heat with a liquid coolant 660 via a liquid-liquid heat exchanger 931 instead of with a refrigerant 280 in a condenser 401. Note that state 471 of the liquid coolant 470 used to reject heat from liquid coolant 660 is at or above ambient temperature, as there are no refrigeration cycles. This transitively means that state 661 of liquid coolant 660 must also be at or above ambient temperature. The management system 651 monitors and adjusts the flow of liquid coolant 660 using flow controlling element 650; there may of course be sensors in the auxiliary cooling loop monitoring the temperature of liquid coolant 470 also in communication with the management system 651, as well as additional flow controlling elements 650 adjusting the flow of coolant 470.

Figure 10:
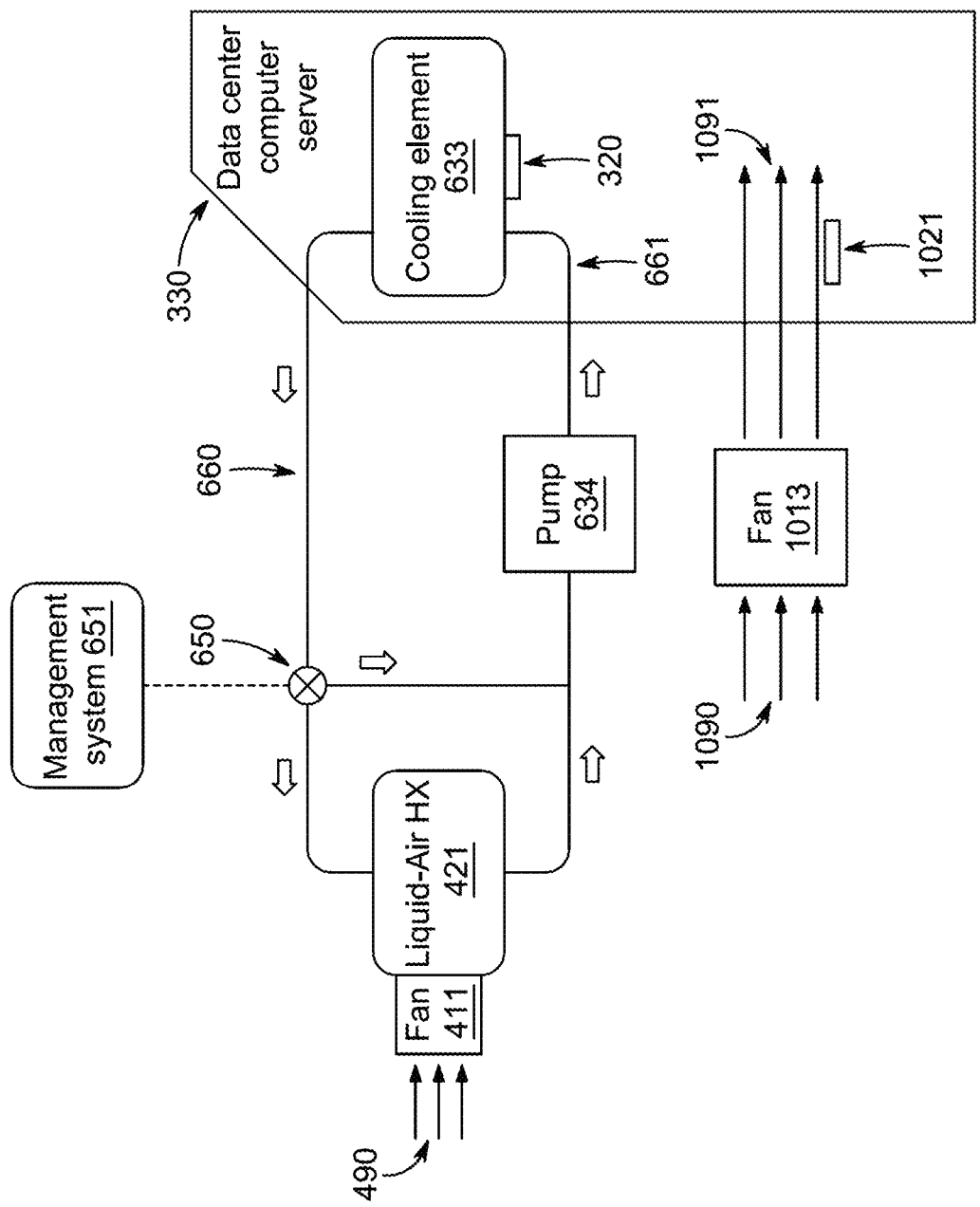
FIG. 10 shows another embodiment of a high temperature thermal management system of the present disclosure, where a liquid coolant provides cooling to a heat-generating element in a data center computer server, and exchanges heat with air at a heat exchanger to reject heat to the ambient environment, and a separate air moving system is used to remove heat from other heat-generating elements not part of the liquid coolant loop.

FIG. 10 shows another embodiment of the high temperature data center thermal management system. In this case, the liquid cooling loop with liquid coolant 660 provides cooling to heat-generating element(s) 320 in data center computer server 330 as described in FIG. 6. However, there may be other heat-generating elements 1021 part of data center computer server 330 that are not serviced by the liquid cooling loop 660.

These other heat-generating elements 1021 may be, for example in certain cases, low power or low power density devices, such as memory chips (DIMMs), power supplies, solid state drives, connectors, capacitors, resistors, voltage regulators, and other such heat-generating devices in data center computer servers. Note that in certain cases the devices mentioned may be incorporated into the liquid cooling loop, at which point they would be considered a heat generating device 320 serviced by the liquid cooling loop.

In any case, a fan or blower 1013 generates an airstream 1090 which provides cooling for heat-generating element 1021, causing air stream 1090 to rise in temperature. The air stream 1090 is then exhausted as air stream 1091 after providing cooling for heat-generating element 1021. Air stream 1090 exhausting air stream 1091 may be an open loop process with no heat exchange beyond that which occurs in cooling of the heat-generating element 1021. Heat-generating element 1021 may also utilize a cooling element similar to cooling element 333 shown in FIG. 3 to facilitate improved heat rejection to air stream 1090, but in many cases it will not.

Note that there may or may not be air conditioning systems used in the air moving system for cooling of heat-generating elements 1021. Due to the lower heat transfer effectiveness of air, a much lower thermal conductance can be achieved for cooling of the lower power components, thereby setting a limit on the temperature of the air. These low power components typically make up a smaller fraction of the total data center energy usage, therefore the reduction in energy with use of the high temperature data center thermal management system still enables high energy efficiency.

In all embodiments discussed thus far, the heat picked up by liquid coolant 660 from heat-generating elements 320 has been eventually dissipated to the ambient environment via air streams 390 or 490. While this accomplishes the requirement of sustaining device temperatures below the maximum allowable, the heat goes unused as it enters the ambient air.

An alternative to this approach is to re-purpose the heat dissipated from heat-generating elements 320 into other processes via waste heat recovery. For a basic example unrelated to data centers, electricity co-generation plants utilize the waste heat from the electricity generation process to provide heat for nearby buildings. More broadly, many industrial processes require input heat to perform their function properly.

There are different types of waste heat recovery, often denoted by the temperature of the waste heat. For example, there are high temperature waste heat recovery processes operating above around 650° C., such as metal refining processes, glass melting processes, incinerator processes, and many others. There are medium temperature waste heat recovery processes operating in the range of around 200-650° C., such as drying and baking ovens, heat treatment furnaces, annealing furnace, and many others. Finally, there are low temperature waste heat processes operating under 200° C., such as welding, injection molding, low temperature ovens, and many others.

As is clear to those skilled in the art, higher temperature waste heat has greater utility when being used for waste heat recovery processes. Waste heat at 650° C., for example, may be used for high temperature waste heat recovery processes, but may also be cooled by the ambient environment with no energy input required to also be used in medium and low temperature waste heat recovery processes. On the other hand, waste heat at 150° C. may only be used for low temperature waste heat recovery processes, and would require high amounts of input energy to be eligible for use in medium and high waste heat recovery processes. All this to say, the higher the temperature of the waste heat, the more processes it may be used for.

As is evident from the temperature ranges outlined in this disclosure, data center processes are most likely to provide heat for low temperature waste heat processes. Even within the range of low temperature waste heat processes under 200° C., having higher temperature waste heat enables more processes. For example, providing heat for buildings may require heat at 30-35° C. On the other hand, certain implementations of the Organic Rankine Cycle (ORC), for example, require waste heat at or above 55° C. Further, ORC systems operating at 55° C. may operate at an efficiency of, for example, near 15%, while those powered at 45° C. may operate at less than 10%, for example. In another example, thermoelectric generators generate electricity based on differences in temperature. This means, the greater the difference in temperature between waste heat and the ambient environment, the more power can be generated from the thermoelectric generator module. For example, with an ambient temperature of 30° C., waste heat at 60° C. may provide up to two times as much power output as a system at 45° C.

Therefore, the presence of a high temperature coolant at or above 55° C. in a data center thermal management system may allow for additional waste heat processes that operate at higher efficiency compared to lower temperature coolants of 45° C. or lower.

Figure 11:
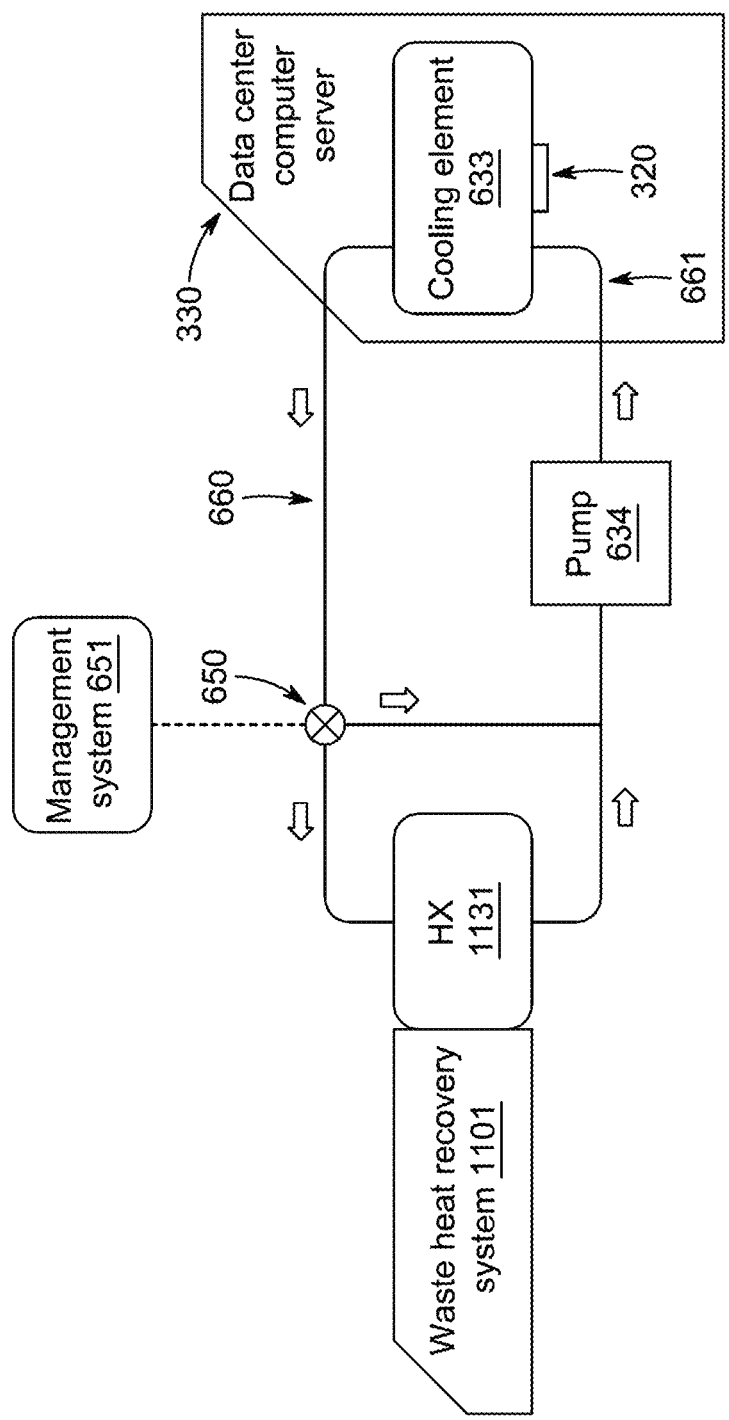
FIG. 11 shows another embodiment of a high temperature thermal management system of the present disclosure, where a liquid coolant provides cooling to a heat-generating element in a data center computer server, and exchanges heat with a waste heat recovery system which utilizes the waste heat of the heat-generating elements instead of dissipating the waste heat to the environment unused.

FIG. 11 displays another embodiment of a high temperature data center thermal management system, now utilizing its waste heat to enable a waste heat recovery process. The cooling loop operates equivalently to that of FIG. 6, except that instead of a liquid-air heat exchanger to reject heat into air stream 490, there is a waste heat recovery system 1101 which rejects the heat from liquid coolant 660 at a heat exchanger 1131 to provide thermal energy to a waste heat recovery process. The waste heat recovery system 1101 may consist of equipment such as regenerators, recuperators, economizers, thermoelectric generators, and others to capture the thermal energy originating from the heat-generating elements 320. There may also be another liquid cooling loop or air blower system as part of the waste heat recovery process to transport the heat from the liquid coolant 660 to the relevant application area of the waste heat recovery system 1101.

Figure 12:
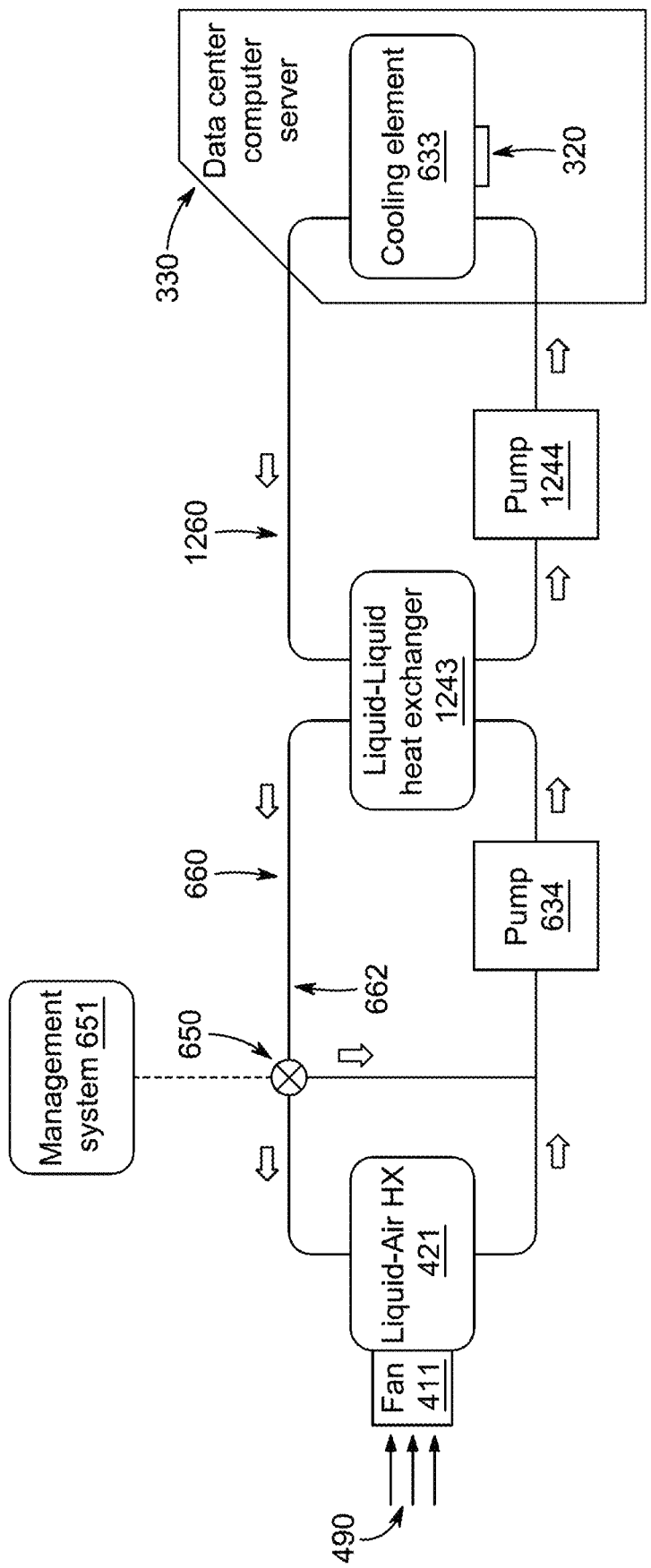
FIG. 12 shows another embodiment of a high temperature thermal management system of the present disclosure, where a management system and flow controlling elements adjust the flow rate of coolant to sustain elevated coolant temperatures in a first coolant loop, while a second coolant loop thermally coupled to the first coolant loop provides cooling to a heat-generating element in a computer server.

FIG. 12 displays still another embodiment of a high temperature data center thermal management system, now utilizing a second coolant loop thermally coupled to a first coolant loop to provide cooling to the at least one heat-generating element. This embodiment includes a first coolant loop with a coolant 660, a pump 634, a liquid-liquid heat exchanger 1243, and a liquid-air heat exchanger 421, a valve 650, and a management system 651. The embodiment also contains a second coolant loop, sometimes referred to as an IT loop or secondary loop, to provide cooling to the at least one heat-generating element 320 in data center computer server 330. In the second coolant loop, there is a coolant 1260, a pump 1244, the liquid-liquid heat exchanger 1243, and a high-thermal-conductance cooling element 633 in thermal communication with a heat generating element 320.

In operation, in the second coolant loop, beginning arbitrarily at the inlet of the pump 1244, coolant 1260 is pumped into the high-thermal-conductance cooling element 633 and accepts heat from heat-generating element 320 in data center computer server 330. This causes the second coolant 1260 to raise in temperature, keeping the heat-generating element 320 at or below its maximum operating temperature. The coolant 1260 continues into the liquid-liquid heat exchanger 1243, which is cooled by the first coolant 660 chilled by the liquid-air heat exchanger 421 in the first coolant loop, described shortly. Note that the coolant 1260 will likely not be cooled down to the temperature of coolant 660, subject to the approach temperature and/or number of heat transfer units of the liquid-liquid heat exchanger 1243. The coolant 1260 returns to the pump 1244 to continue the loop.

In the first coolant loop, beginning arbitrarily at the inlet of the pump 634, the pump 634 causes the liquid coolant 660 to flow by raising its pressure. The liquid coolant enters the liquid-liquid heat exchanger 1243 and accepts heat from the second coolant 1260. This causes the liquid coolant 660 to raise in temperature, keeping the second coolant 1260 at a temperature such that it maintains the temperature of the heat-generating element 320 at or below its maximum operating temperature. The coolant 660 then approaches the valve 650, of which a management system 651 senses the temperature at state 662 at the inlet of the valve. Depending on the temperature of the coolant 660 and the configuration of the management system, the flow either enters into liquid-air heat exchanger 421 being cooled by fan 411 taking in ambient air 490 before returning to the pump 634, or bypasses directly to the pump 634, to continue the loop. The power of the fan 411 may also be adjusted from, for example, 0-100%, depending on the current cooling needs of the heat generating element 320 and the temperature of the ambient air 490.

Often, the coolant 660 will be a liquid coolant, such as, for example, water or a water-glycol mixture, often forming part of a facility water infrastructure. The second coolant 1260 may be the same or different from the coolant 660. In some instances, the pump and liquid-liquid heat exchanger may be packaged into a coolant distribution unit (CDU), for example, which may form part of a single piece of off-the-shelf hardware. A CDU may offer compatibility to the second coolant 1260 with water, water-glycol, or other coolants. In other instances, the pump 1244 and liquid-liquid heat exchanger 1243 may be packaged as part of an immersion cooling assembly (not shown), such as an immersion cooling bath or immersion server slice chassis. Note that in this configuration the lines between components in FIG. 12 may or may not signify tube or pipe connections. These and other configurations are evident to those skilled in the art.

The present disclosure has described a high temperature electronic device thermal management system which offers a low energy usage, high energy efficiency cooling system for computer servers. In one embodiment, a liquid coolant at elevated temperature is administered. A pump elevates the pressure of a liquid coolant, causing it to flow throughout a liquid cooling loop. A high-thermal-conductance cooling element facilitates high efficiency removal of heat from heat-generating electronic devices (e.g., in data center computer servers), sustaining device temperatures below the maximum allowable even when coolants are at high temperature, such as those above the ambient temperature, the yearly annual maximum temperature, or even those at or above 55° C. The heat from the liquid coolant is then given off, whether to the ambient environment or to a waste heat recovery system, and continues anew in the liquid coolant loop. To implement this low energy usage data center thermal management system configuration, the high temperature data center thermal management system is equipped with a management system configured to sense the coolant and ambient temperatures, catalogue the yearly annual maximum temperature, and adjust the flow rates in the system based on the sensed temperatures. Flow controlling elements in communication with the management system are administered to adjust the flow and in doing so sustain elevated coolant temperatures for low energy usage.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

Examples of the systems and methods described herein comprise computer components and computer-implemented steps that will be apparent to those skilled in the art. For example, it should be understood by one of skill in the art that the computer-implemented steps may be stored as computer-executable instructions on a computer-readable medium such as, for example, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

Functions, methods, and/or components of the methods and systems disclosed herein according to various aspects and examples may be implemented or carried out in a digital signal processor (DSP) and/or other circuitry, analog or digital, suitable for performing signal processing and other functions in accord with the aspects and examples disclosed herein. Additionally or alternatively, a microprocessor, a logic controller, logic circuits, field programmable gate array(s) (FPGA), application-specific integrated circuits) (ASIC), general computing processor(s), microcontroller(s), and the like, or any combination of these, may be suitable, and may include analog or digital circuit components and/or other components with respect to any particular implementation.

Any suitable hardware and/or software, including firmware and the like, may be configured to carry out or implement components of the aspects and examples disclosed herein, and various implementations of aspects and examples may include components and/or functionality in addition to those disclosed. Various implementations may include stored instructions for a digital signal processor and/or other circuitry to enable the circuitry, at least in part, to perform the functions described herein.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A cooling system for cooling a heat-generating electronic device, comprising:
    a first cooling loop, comprising
        a first coolant that is configured to remove heat created by the heat-generating electronic device,
        at least one component which acts to elevate a pressure of the first coolant, and
        a first heat exchanger interface that is configured to transfer heat out of the first coolant;
    a bypass path bypassing the first heat exchanger interface and forming a fluid path between portions of the first cooling loop;
    at least one flow controlling element configured to control a flow rate of the first coolant within the portions of the first cooling loop and a flow rate of the first coolant through the bypass path; and
    a management system configured to
        sense the temperature of the first coolant,
        sense the current temperature at a location either inside of or outside of the location of the heat-generating electronic device,
        obtain a periodic maximum temperature of an ambient environment in the vicinity of the location of the electronic device, and
        control the at least one flow controlling element, based on the sensed coolant temperature and a temperature of the heat-generating electronic device, to adjust the flow rate of the first coolant within the portions of the first cooling loop and the flow rate of the first coolant through the bypass path.

2. The cooling system of claim 1, wherein the management system is configured to control the at least one flow controlling element, based on the sensed coolant temperature, the temperature of the heat-generating electronic device, and at least one of the current temperature and the periodic maximum temperature, to adjust the flow rate of the first coolant within the portions of the first cooling loop and the flow rate of the first coolant through the bypass path.

3. The cooling system of claim 1, wherein the management system is configured to maintain the first coolant temperature above the sensed current temperature.

4. The cooling system of claim 1, wherein the management system is configured to maintain the first coolant temperature above the periodic maximum temperature.

5. The cooling system of claim 1, wherein the management system is configured to maintain the first coolant temperature above 55° C.

6. The cooling system of claim 1, wherein the first coolant is a single-phase coolant.

7. The cooling system of claim 1, wherein the only change of phase of the first coolant occurs at the first heat exchanger interface.

8. The cooling system of claim 1, wherein the first coolant is a liquid coolant.

9. The cooling system of claim 8, wherein the first coolant comprises any one of water and a water-glycol mix.

10. The cooling system of claim 1, further comprising an air cooling system to provide cooling for other heat generating elements.

11. The cooling system of claim 1, further comprising a second cooling loop comprising a second coolant that is configured to transfer heat from the heat-generating electronic device to the first coolant, at least one component that acts to elevate the pressure of the second coolant, and a second heat exchanger interface that is configured to transfer heat out of the second coolant.

12. The cooling system of claim 11, wherein the second coolant is a liquid coolant.

13. The cooling system of claim 12, wherein the second coolant comprises any one of water, a water-glycol mix, and a dielectric fluid.

14. The cooling system of claim 11, wherein the first heat exchanger interface is configured to interface with the ambient environment and the second heat exchanger interface is configured to transfer heat between the second coolant and the first coolant.

15. The cooling system of claim 14, wherein heat is transferred from the second coolant to the first coolant using a liquid-liquid heat exchanger.

16. The cooling system of claim 11, further comprising at least one cooling element that is configured to facilitate direct contact of the second coolant with a heat generating electronic device.

17. The cooling system of claim 1, wherein the first heat exchanger interface comprises a liquid-air heat exchanger.

18. The cooling system of claim 1, wherein the at least one flow controlling element is configured to variably direct either none, some, or all of the first coolant to the first heat exchanger interface.

19. The cooling system of claim 1, further comprising at least one cooling element that is configured to facilitate direct contact of the first coolant with a heat generating electronic device.

20. The cooling system of claim 1, wherein the first heat exchanger interface comprises a heat exchanger that is configured to interface with a waste heat recovery system.

21. A cooling system for cooling a heat-generating electronic device, comprising:
    a first cooling loop, comprising
        a first coolant that is configured to remove heat created by the heat-generating electronic device,
        at least one component which acts to elevate a pressure of the first coolant, and
        a first heat exchanger interface that is configured to transfer heat out of the first coolant;
    a bypass path bypassing the first heat exchanger interface and forming a fluid path between portions of the first cooling loop;
    at least one flow controlling element configured to control a flow rate of the first coolant within the portions of the first cooling loop and a flow rate of the first coolant through the bypass path; and a management system configured to
sense the temperature of the first coolant,
sense the current temperature at a location either inside of or outside of the location of the heat-generating electronic device,
obtain a periodic maximum temperature of an ambient environment in the vicinity of the location of the electronic device, and
control the at least one flow controlling element, based on a temperature of the heat-generating electronic device and at least one of the current temperature and the periodic maximum temperature, to adjust the flow rate of the first coolant within the portions of the first cooling loop and the flow rate of the first coolant through the bypass path.

* * * * *